(12) United States Patent
Kushida

(10) Patent No.: US 6,919,738 B2
(45) Date of Patent: Jul. 19, 2005

(54) OUTPUT BUFFER CIRCUIT, MEMORY CHIP, AND SEMICONDUCTOR DEVICE HAVING A CIRCUIT FOR CONTROLLING BUFFER SIZE

(75) Inventor: Keiichi Kushida, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/327,939

(22) Filed: Dec. 26, 2002

(65) Prior Publication Data

US 2003/0122574 A1 Jul. 3, 2003

(30) Foreign Application Priority Data

Dec. 27, 2001 (JP) .......................................... 2001-395749

(51) Int. Cl.[7] ......................................... H03K 19/0175
(52) U.S. Cl. .............................. 326/82; 326/30; 326/85; 326/87; 365/189.05; 365/189.08
(58) Field of Search ........................ 326/30, 82, 85–87; 365/189.05, 189.08

(56) References Cited

U.S. PATENT DOCUMENTS

| 4,719,369 | A | * | 1/1988 | Asano et al. ................. 326/30 |
|---|---|---|---|---|
| 5,955,894 | A | * | 9/1999 | Vishwanthaiah et al. ..... 326/86 |
| 6,114,895 | A | * | 9/2000 | Stephens ..................... 327/391 |
| 6,118,310 | A | * | 9/2000 | Esch, Jr. ..................... 327/108 |
| 6,163,499 | A | * | 12/2000 | Suzuki ................... 365/230.06 |
| 6,166,563 | A | * | 12/2000 | Volk et al. ..................... 326/87 |
| 6,307,791 | B1 | * | 10/2001 | Otsuka et al. ......... 365/189.05 |
| 6,347,850 | B1 | * | 2/2002 | Volk ............................. 326/82 |
| 6,446,487 | B1 | * | 9/2002 | Van Wesenbeeck et al. . 73/23.2 |
| 6,466,487 | B1 | * | 10/2002 | Otsuka .................. 365/189.05 |

OTHER PUBLICATIONS

Harold Pilo, et al., "A 300MHz, 3.3V 1Mb SRAM Fabricated in a 0.5μm CMOS Process", 1996 IEEE International Solid–State Circuits Conference, ISSCC96/Session 9/SRAM/Paper FA 9.3, 1996 Digest of Technical Papers, 42nd ISSCC, pp. 148–149, 433.

* cited by examiner

Primary Examiner—Michael Tokar
Assistant Examiner—Khai Nguyen
(74) Attorney, Agent, or Firm—Oblon, Spivak, McClelland, Maier & Neustadt, P.C.

(57) ABSTRACT

An output buffer circuit including a programmable impedance buffer configured to match a buffer size thereof with an external impedance, a buffer size decision circuit configured to generate a plurality of buffer size signals for determining the buffer size of the programmable impedance buffer synchronized with a first clock signal, and an impedance adjustment circuit configured to adjust the buffer size based on the buffer size signals in response to a level of an output data signal.

25 Claims, 15 Drawing Sheets

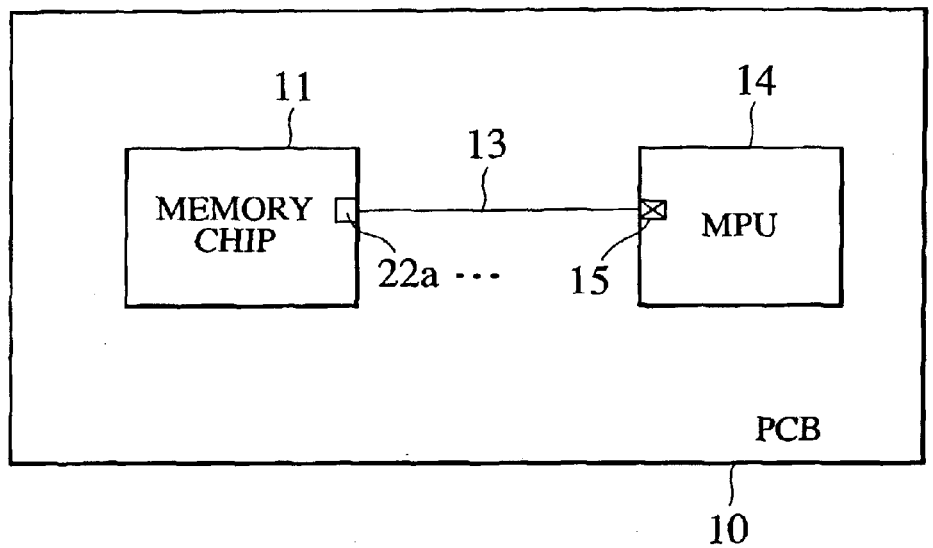
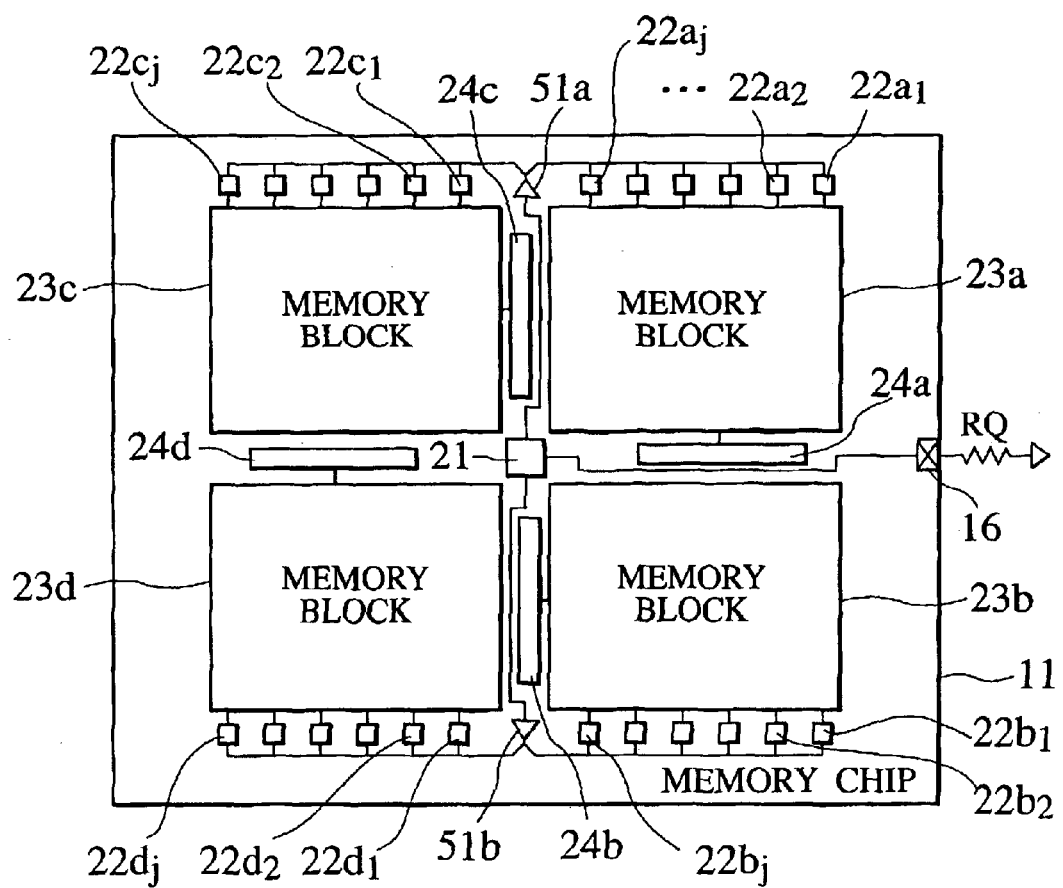

OUTPUT BUFFER CIRCUIT, MEMORY CHIP, AND SEMICONDUCTOR DEVICE HAVING A CIRCUIT FOR CONTROLLING BUFFER SIZE

CROSS REFERENCE TO RELATED APPLICATIONS

This application is based upon and claims the benefit of priority from the prior Japanese Patent Application No.2001-395749 filed on Dec. 27, 2001; the entire contents of which are incorporated herein by reference.

BACKGROUND OF THE INVENTION

1. Field of the Invention

The present invention relates to an output buffer circuit, a memory chip and a semiconductor device having a circuit for controlling a buffer size. More specifically, the present invention relates to an output buffer circuit having an adjusting function for matching a buffer size of a programmable impedance buffer with external impedance.

2. Description of Related Art

In recent years, data transfer rates required for a semiconductor memory device (a memory chip) have increased and the operating frequency thereof has reached a level of several hundred MHz. In data transmission at such high frequencies, there is a risk of data signal reflection, which may interfere with the normal transmission of data signals. Data signal reflection is caused by a certain impedance, which is attributable to resistance and inductance of wiring connected to the memory chip, or attributable to a capacity of a connected device. If the operating conditions are fixed, data signal reflection is avoidable by matching the internal impedance and the external impedance of the memory chip. However, physically, the internal impedance of a memory chip varies easily according to changes in operating voltages or external factors such as temperature.

Accordingly, the external impedance is referenced by use of a programmable impedance circuit technology, so that the internal impedance of the memory chip is automatically matched with the external impedance regardless of changes in operating voltages or temperatures. To be more precise, impedance of a programmable impedance buffer (hereinafter referred to as a "buffer size") inside the memory chip is matched with the external impedance at high precision by varying the driving force of a transistor which constitutes the programmable impedance buffer. From the point of circuit design, the impedance deviation which is attributable to the changes in the environment is thereby corrected.

Such adjustment of the buffer size is carried out in a writing operation or in a "no operation (NOPE)" state, but not in a reading operation. Therefore, if the internal impedance of the memory chip is changed during continuous reading operations, the buffer size cannot be adjusted and data signal reflection occurs.

SUMMARY OF THE INVENTION

A first aspect of the present invention provides an output buffer circuit including a programmable impedance buffer configured to match a buffer size thereof with an external impedance, a buffer size decision circuit configured to generate a plurality of buffer size signals for determining the buffer size of the programmable impedance buffer synchronized with a first clock signal, and an impedance adjustment circuit configured to adjust the buffer size based on the buffer size signals in response to a level of an output data signal.

A second aspect of the present invention provides an output buffer circuit including a programmable impedance buffer configured to match a buffer size thereof with an external impedance, a buffer size decision circuit, a first register, a second register, and an impedance adjustment circuit. The buffer size decision circuit includes a buffer size signal unit configured to generate a plurality of buffer size signals for determining the buffer size of the programmable impedance buffer, and a filter signal unit configured to generate a first filter signal, the first filter signal being set to a first level for only a certain period before and after changing of the buffer size signals. The first register converts the first filter signal into a second filter signal synchronized with the first clock signal. The second register registers the buffer size signals in a period when the second filter signal is at a second level being opposite to the first level. The impedance adjustment circuit adjusts the buffer size based on the buffer size signals registered in the second register, in response to a level of the output data signal supplied from an internal circuit.

A third aspect of the present invention provides a memory chip including a memory block configured to storage a data, a timing/address unit connected to the memory block, configured to control operation timing of the memory block, a data output unit connected to the memory block, including a programmable impedance duffer configured to match a buffer size thereof with an external impedance, a buffer size decision circuit configured to generate a plurality of buffer size signals for determining the buffer size based on a first clock signal, and an intermediate buffer configured to amplify the buffer size signals and transfer the buffer size signals to the data output unit.

A fourth aspect of the present invention provides a memory chip including a memory block configured to storage a data, a data output unit connected to the memory block, and a buffer size decision circuit. The data output unit including a programmable impedance buffer configured to match a buffer size thereof with an external impedance and an impedance adjustment circuit configured to adjust the buffer size of the programmable impedance buffer based on buffer size signals in response to a level of an output data signal. The buffer size decision circuit generates a plurality of buffer size signals for determining the buffer size synchronized with a first clock signal.

A fifth aspect of the present invention provides a semiconductor device including a printed circuit board, a micro processing unit mounted on the printed circuit board, a data bus connected to the micro processing unit, and a memory chip connected to the data bus. The memory chip includes a memory block configured to storage a data, a data output unit connected to the memory block, and a buffer size decision circuit. The data output unit includes a programmable impedance buffer configured to match a buffer size thereof with an external impedance and an impedance adjustment circuit configured to adjust a buffer size of the programmable impedance buffer based on buffer size signals in response to a level of an output data signal. The buffer size decision circuit generates a plurality of buffer size signals for determining the buffer size synchronized with a first clock signal.

BRIEF DESCRIPTION OF THE DRAWINGS

FIG. 1 is a plan view showing a configuration example of a semiconductor device according to a first embodiment of the present invention.

FIG. 2 is a plan view showing a layout example of the memory chip illustrated in FIG. 1.

DETAILED DESCRIPTION OF EMBODIMENTS

Figure 3:
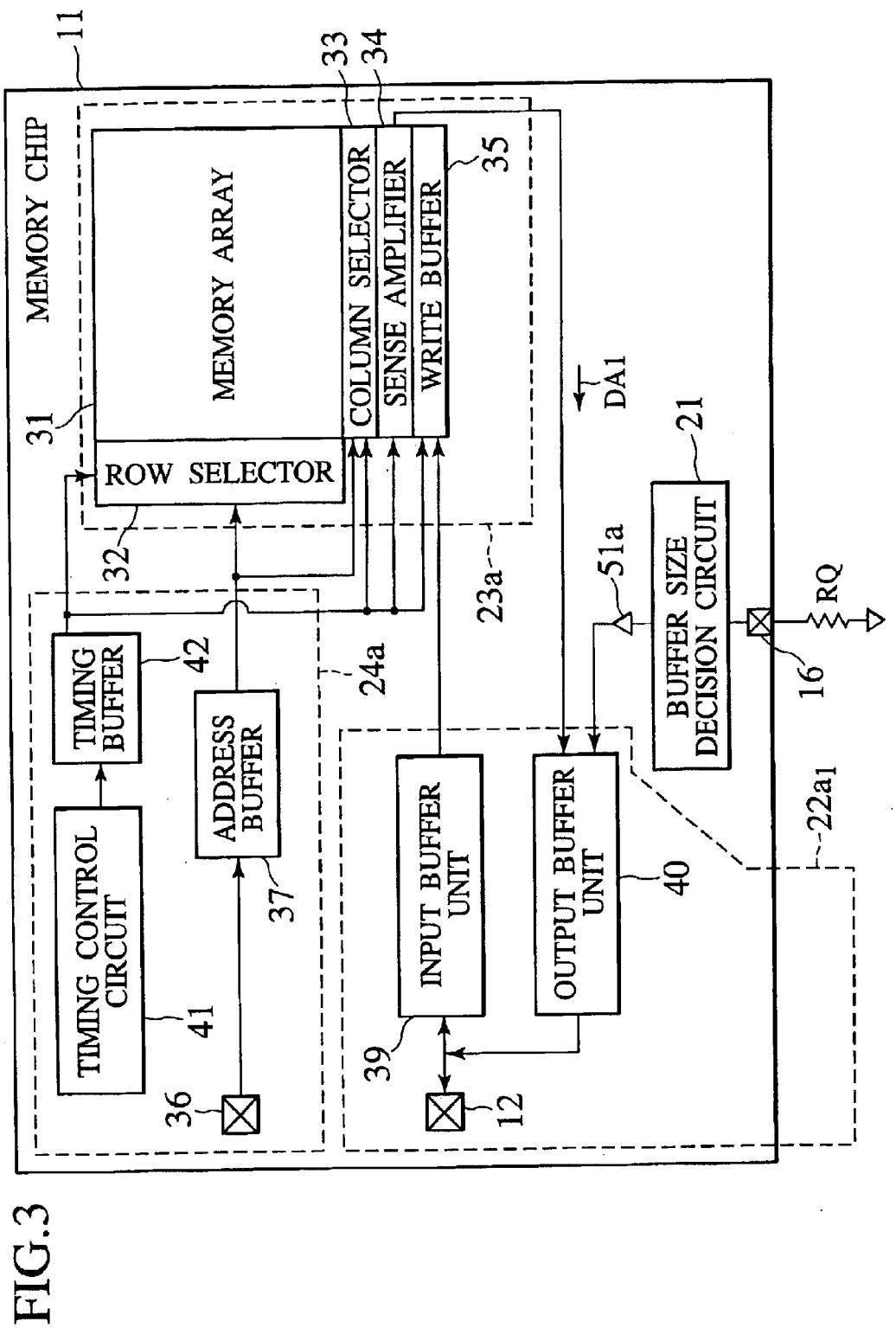
FIG. 3 is a block diagram showing a configuration of the memory chip illustrated in FIG. 1.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

As shown in FIG. 1, a semiconductor device according to a first embodiment of the present invention includes a printed circuit board (PCB) 10, a memory chip 11 mounted on the PCB 10, and a micro processing unit (MPU) 14 connected to the memory chip 11. A data output unit $22a$ in the memory chip 11 is connected via a data bus 13 to an input terminal 15 in the MPU 14 placed on the PCB 10.

As shown in FIG. 2, the memory chip 11 includes four memory blocks $23a$ to $23d$, for example, four timing/address units $24a$ to $24d$ connected respectively to the memory blocks $23a$ to $23d$, a plurality of data output units $22a_1$, $22a_2$, - - - , $22a_j$, $22b_1$, $22b_2$, - - - , $22b_j$, $22c_1$, $22c_2$, - - - , $22c_j$, $22d_1$, $22d_2$, - - - , $22d_j$ which are connected respectively to the memory blocks $23a$ to $23d$, an intermediate buffer $51a$ connected to the data output units $22a_1$, $22a_2$, - - - , $22a_j$, $22c_1$, $22c_2$, - - - , $22c_j$, another intermediate buffer $51b$ connected to the data output unit $22b_1$, $22b_2$, - - - , $22b_j$, $22d_1$, $22d_2$, - - - , $22d_j$, a buffer size decision circuit 21 connected to the intermediate buffers $51a$, $51b$, and an external terminal 16 connected to the buffer size decision circuit 21. The four memory blocks $23a$ to $23d$ are disposed evenly in the form of a 2×2 matrix, and the data output units $22a_1$, $22a_2$, - - - , $22a_j$, and so on are disposed linearly in spaces between the periphery of the memory chip 11 and the memory blocks $23a$ to $23d$. The buffer size decision circuit 21 is disposed in the middle position of the four memory blocks $23a$ to $23d$, i.e. in the center of the memory chip 11. An external resistor RQ is connected to the external terminal 16. The timing/address units $24a$ to $24d$ are disposed between memory blocks $23a$ to $23d$, respectively. The number of the memory blocks $23a$ to $23d$ is not limited to four: the number may be in a range from one to three or larger than four. Moreover, the number (j) of the data output units $22a_1$, $22a_2$, - - - , $22a_j$ and so on corresponds to the capacity of the data bus 13. Specifically, if the data bus 13 in FIG. 1 has the capacity of j bits, then the corresponding number (j) of the data output units $22a_1$, $22a_2$, - - - , $22a_j$ and so on are actually exist on the memory chip 11.

Each of the memory blocks $23a$ to $23d$ has a data storage function. Each of the data output units $22a_1$, $22a_2$, - - - , $22a_j$; $22b_1$, $22b_2$, - - - , $22b_j$; $22c_1$, $22c_2$, - - - , $22c_j$; $22d_1$, $22d_2$, - - - , $22d_j$ transfer the data stored in the respective memory blocks $23a$ to $23d$ to the outside of the memory chip 11.

To facilitate explanation, only the memory block $23a$ in FIG. 2 is shown in FIG. 3. Namely, the memory block $23a$ includes a memory array 31 having a plurality of memory cells disposed in the form of a matrix, row and column selectors 32 and 33 connected to the memory array 31, a sense amplifier 34 connected to the column selector 33, and a write buffer 35 connected to the sense amplifier 34. As shown in FIG. 3, the memory block $23a$ is disposed on the memory chip 11. The memory chip 11 further includes the timing/address unit $24a$ and the data output unit $22a_1$. The timing/address unit $24a$ includes an address terminal 36 to which an address signal is inputted, and an address buffer 37 connected between the address terminal 36 and the row selector 32 as well as the column selector 33, a timing control circuit 41 configured to control operation timing in the event of writing or reading, and a timing buffer 42 connected between the timing control circuit 41 and the row selector 32, column selector 33, the sense amplifier 34 and the write buffer 35. The data output unit $22a_1$ includes an I/O terminal 12 connected to the data bus 13 in FIG. 1, an input buffer unit 39 connected between the I/O terminal 12 and the write buffer 35, and an output buffer unit 40 connected between the I/O terminal 12 and the sense amplifier 34. To avoid cluttering up the drawing, illustration of other data output unit $22b_1$, - - - , $22b_j$, connected to the memory block $23a$ is omitted. The memory chip 11 further includes the intermediate buffer $51a$ connected to the output buffer unit 40, the buffer size decision circuit 21 connected to the intermediate buffer $51a$, the external terminal 16 connected to the buffer size decision circuit 21. The external resistor RQ is connected to the external terminal 16. Here, it is to be noted that the locations of the respective constituents in FIG. 3 are different from an actual configuration.

As stated above, to facilitate explanation, FIG. 3 does not illustrate the other memory blocks 23b to 23d. Also, the illustration of the data output units $22b_1$, $22b_2$, - - - , $22b_j$, $22c_1$, $22c_2$, - - - , $22c_j$, $22d_1$, $22d_2$, - - - , $22d_j$, and the timing/address units 24b to 24d, which are shown in FIG. 2, are omitted. The other memory blocks 23b to 23d have a configuration similar to the memory block 23a shown in FIG. 3. Meanwhile, other data output units $22b_1$, $22b_2$, - - - , $22b_j$, and so on have a configuration similar to the data output unit 22a shown in FIG. 3. The timing/address units 24b to 24d have a configuration similar to the timing/address unit 24a shown in FIG. 3.

To facilitate explanation, FIG. 3 illustrates only one address terminal 36 and one address buffer 37. However, actual address signals include n bits of row address signals and m bits of column address signals. Accordingly, n+m address terminals 36 actually exist, and the address buffer 37 includes n row address buffers and m column address buffers. Then, the n row address buffers are connected to the row selector 32, and the m column address buffers are connected to the column selector 33.

To facilitate explanation, FIG. 3 illustrates only one I/O terminal 12, one input buffer unit 39, and one output buffer unit 40. However, if the capacity of the data bus 13 in FIG. 1 is j bits, then j I/O terminals 12, j input buffer units 39, and j output buffer units 40 actually exist on the memory chip 11.

The row selector 32 and the column selector 33 select a desired memory cell in the memory array 31 in accordance with the address signal inputted from the address terminal 36. Write data and read data are inputted from and outputted to the I/O terminal 12. The input buffer unit 39 transfers the write data to the write buffer 35. The write buffer 35 writes the data in the desired memory cell. The sense amplifier 34 transfers the read data to the output buffer unit 40. The output buffer unit 40 outputs the read data to the outside of the memory chip 11 as the third output data signal DA3 (shown in FIG. 4) via the I/O terminal 12. The buffer size decision circuit 21 references the external resistor RQ and automatically adjusts the impedance of the programmable impedance buffer in the output buffer unit 40, i.e. "the buffer size". The external resistor RQ designates the impedance to be matched by the buffer size decision circuit 21. The timing control circuit 41 outputs a timing control signal to the timing buffer 42. In the event of writing or reading, operation timing of the row selector 32, the column selector 33, the sense amplifier 34, and the write buffer 35 are controlled by the timing control signal supplied through the timing buffer 42.

Figure 4:
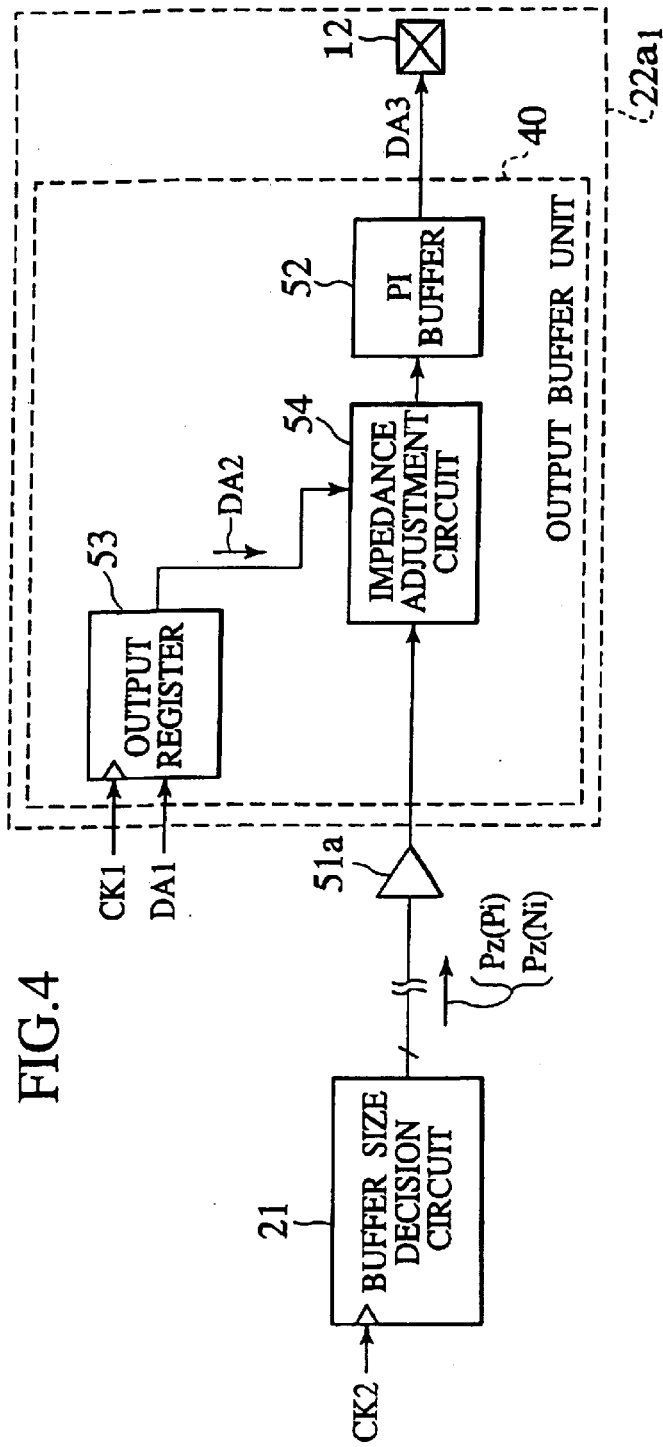
FIG. 4 is a block diagram showing an output buffer unit and a buffer size decision circuit illustrated in FIG. 3.

With reference to FIG. 4, description will be made regarding the configurations of the output buffer unit 40 and the buffer size decision circuit 21 of the memory chip 11 shown in FIG. 3. The output buffer unit 40 includes an output register 53 to which a first output data signal DA1 transferred from the sense amplifier 34 in FIG. 3 is supplied, an impedance adjustment circuit 54 connected to the output register 53, and a programmable impedance buffer (hereinafter referred to as a "PI buffer") 52 connected to the impedance adjustment circuit 54. The buffer size decision circuit 21 is connected to the impedance adjustment circuit 54 via an intermediate buffer 51a. The PI buffer 52 is connected to the I/O terminal 12.

The output register 53 retrieves the first output data signal DA1 synchronously with an inverted clock signal CK', which is a signal inverted from a first clock signal CK1. Then, the output register 53 transfers a second output data signal DA2, which is synchronous with the first clock signal CK1, to the impedance adjustment circuit 54. The buffer size decision circuit 21 generates buffer size signals Pz (Pi) and Pz (Ni) synchronously with a second clock signal CK2. Here, the buffer size signals Pz (Pi) and Pz (Ni) have a data amount of 6 bits×2, and "i" is an integer in a range from 0 to 5. Thereafter, buffer size decision circuit 21 transfers the buffer size signals Pz (Pi) and Pz (Ni) to the intermediate buffer 51a. Note that the buffer size signals Pz (Pi) and Pz (Ni) are configured to determine the buffer size of the PI buffer 52. The buffer size of the PI buffer 52 is controlled by the buffer size signals Pz (Pi) and Pz (Ni). The second clock signal CK2 is synchronized with the first clock signal CK1, and has a longer cycle than the cycle of the first clock signal CK1. This is because the rate of change of an operating voltage of the memory chip 11 or an external factor such as temperature is sufficiently slower than the frequency of the first clock signal CK1. For example, one cycle of the second clock signal is equivalent to 64 cycles of the first clock signal CK1. Therefore, the buffer size decision circuit 21 generates the buffer size signals Pz (Pi) and Pz (Ni) every 64 cycles of the first clock signal CK1. The intermediate buffer 51a amplifies the buffer size signals Pz (Pi) and Pz (Ni) supplied from the buffer size decision circuit 21 and then transfers the buffer size signals to the impedance adjustment circuit 54. The impedance adjustment circuit 54 adjusts the buffer size of the PI buffer 52 based on the buffer size signals Pz (Pi) and Pz (Ni) in response to the level of the second output data signal DA2.

Figure 5:
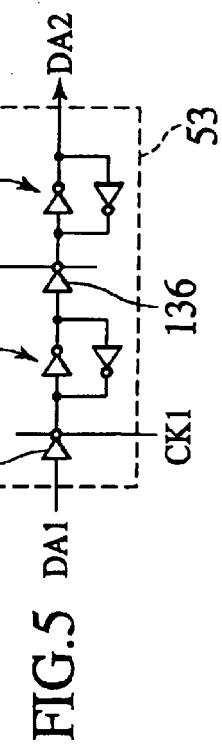
FIG. 5 is a circuit diagram showing an output register illustrated in FIG. 4.

As shown in FIG. 5, the output register 53 includes two transfer gates 135 and 136 which open and close in response to the level of the first clock signal CK1, and two latch circuits 137 and 138. The two transfer gates 135 and 136 are disposed alternately with the two latch circuits 137 and 138 connected in series. The output register 53 converts the first output data signal DA1 synchronized with the inverted clock signal CK' into the second output data signal DA2 synchronized with the first clock signal CK1.

Figure 6:
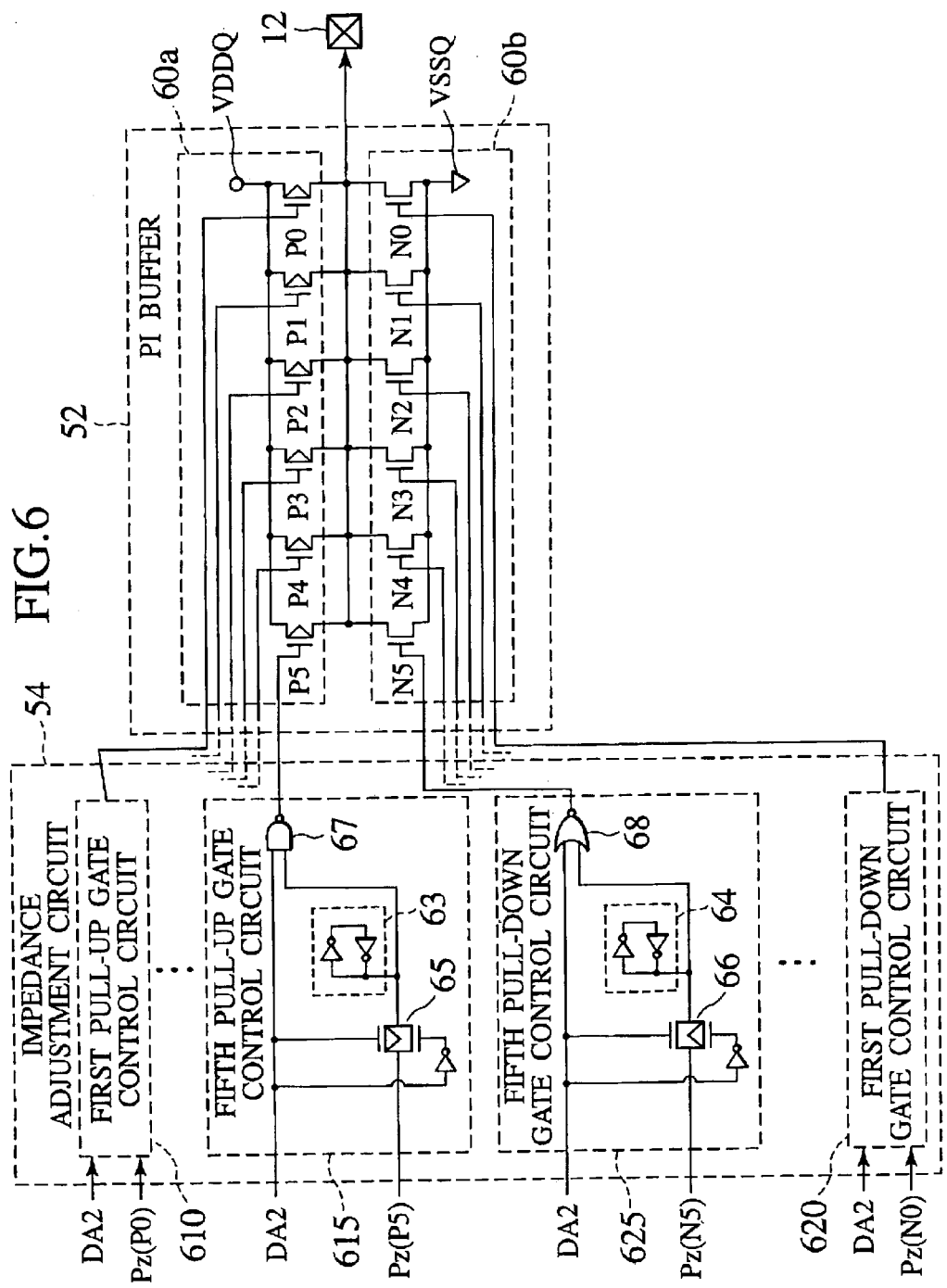
FIG. 6 is a detailed circuit diagram showing the programmable impedance buffer and an impedance adjustment circuit illustrated in FIG. 4.

With reference to FIG. 6, description will be made regarding the PI buffer 52 and the impedance adjustment circuit 54 shown in FIG. 4. The PI buffer 52 includes a pull-up output transistor group 60a and a pull-down output transistor group 60b. The pull-up output transistor group 60a includes a plurality of first transistors connected in parallel (such transistors will be implemented by "p-channel MOS transistors") P0 to P5. The pull-down output transistor group 60b includes a plurality of second transistors connected in parallel (such transistors will be implemented by "n-channel MOS transistors") N0 to N5 having opposite polarity to the first transistors P0 to P5. Here, the pull-up output transistor group 60a includes six p-channel MOS transistors P0 to P5, and the pull-down output transistor group 60b includes six n-channel MOS transistors N0 to N5. One end of an electric current path (a drain electrode) of every p-channel MOS transistor P0 to P5 and one end of an electric current path (a drain electrode) of every n-channel MOS transistor N0 to N5 are connected to the I/O terminal 12. A first high-level power supply voltage VDDQ is applied to the other end of the electric current path (a source electrode) of every p-channel MOS transistor P0 to P5. A first low-level power supply voltage VSSQ is applied to the other end of the electric current path (a source electrode) of every n-channel MOS transistor N0 to N5. Note that the first low-level power supply voltage VSSQ may be set to ground potential. The p-channel MOS transistors P0, P1, P2, P3, P4, and P5 have channel widths equivalent to once, twice, four times, eight times, sixteen times, and thirty-two times a unit channel width W, respectively. The n-channel MOS transistors N0, N1, N2, N3, N4, and N5 have channel widths equivalent to once, twice, four times, eight times, sixteen times, and thirty-two times a unit channel width W', respectively.

Meanwhile, the impedance adjustment circuit 54 includes a plurality of pull-up gate control circuits 610 to 615 connected respectively to control electrodes of the p-channel MOS transistors P0 to P5, and a plurality of pull-down gate control circuits 620 to 625 connected respectively to control electrodes of the n-channel MOS transistors N0 to N5. The number of the first gate control circuits 610 to 615 is equal to the number of the p-channel MOS transistors P0 to P5 (six pieces), and the number of the second gate control circuits 620 to 625 is equal to the number of the n-channel MOS transistors N0 to N5 (six pieces).

The fifth pull-up gate control circuit 615 includes a first switch 65 to which the second output data signal DA2 is supplied, a first latch circuit 63 to which a buffer size signal Pz (P5) is supplied via the first switch 65, and a NAND circuit 67 to which the second output data signal DA2 and the buffer size signal Pz (P5) held by the first latch circuit 63 are supplied. An output terminal of the NAND circuit 67 is connected to the control electrode of the p-channel MOS transistor P5.

The fifth pull-down gate control circuit 625 includes a second switch 66 to which the second output data signal DA2 is supplied, a second latch circuit 64 to which a buffer size signal Pz (N5) is supplied via the second switch 66, and a NOR circuit 68 to which the second output data signal DA2 and the buffer size signal Pz (N5) held by the second latch circuit 64 are supplied. An output terminal of the NOR circuit 68 is connected to the control electrode of the n-channel MOS transistor N5.

The first switch 65 opens and closes depending on the level of the second output data signal DA2. The first latch circuit 63 holds the buffer size signal Pz (P5) when the first switch 65 is open. To be more precise, the first switch 65 opens when the second output data signal DA2 is at a low level, and closes when the second output data signal DA2 is at a high level. The NAND circuit 67 applies a low level to the control electrode of the p-channel MOS transistor P5 when the second output data signal DA2 is at a high level and the buffer size signal Pz (P5) held by the first latch circuit 63 is also at a high level.

The second switch 66 opens and closes depending on the level of the second output data signal DA2. The second latch circuit 64 holds the buffer size signal Pz (N5) when the second switch 66 is open. To be more precise, the second switch 66 opens when the second output data signal DA2 is at a high level, and closes when the second output data signal DA2 is at a low level. The NOR circuit 68 applies a high level to the control electrode of the n-channel MOS transistor N5 when the second output data signal DA2 is at a low level and the buffer size signal Pz (N5) held by the second latch circuit 64 is also at a low level.

Note that illustration of the circuit configurations of the first to fourth pull-up gate control circuits 610 to 614 and of the first to fourth pull-down gate control circuits 620 to 624 are omitted in FIG. 6. However, the first to fourth pull-up gate control circuits 610 to 614 have circuit configurations similar to that of the fifth pull-up gate control circuit 615, and the first to fourth pull-down gate control circuits 620 to 624 have circuit configurations similar to that of the fifth pull-down gate control circuit 625. Each of the first to fourth pull-up gate control circuits 610 to 614 includes the first switch 65, the first latch circuit 63 to which the buffer size signals Pz (P0) to Pz (P4) is supplied via the first switch 65, and the NAND circuit 67 to which the second output data signal DA2 and the buffer size signals Pz (P0) to Pz (P4) held by the first latch circuit 63 is supplied. The output terminal of each NAND circuit 67 is connected to the control electrode of the p-channel MOS transistor P0 to P4. Each of the first to fourth pull-down gate control circuits 620 to 624 includes the second switch 66, the second latch circuit 64 to which the buffer size signals Pz (N0) to Pz (N4) are supplied via the second switch 66, and the NOR circuit 68 to which the second output data signal DA2 and the buffer size signals Pz (N0) to Pz (N4) held by the second latch circuit 64 are supplied. The output terminal of each NOR circuit 68 is connected to the control electrode of the n-channel MOS transistor N0 to N4.

Figure 7:
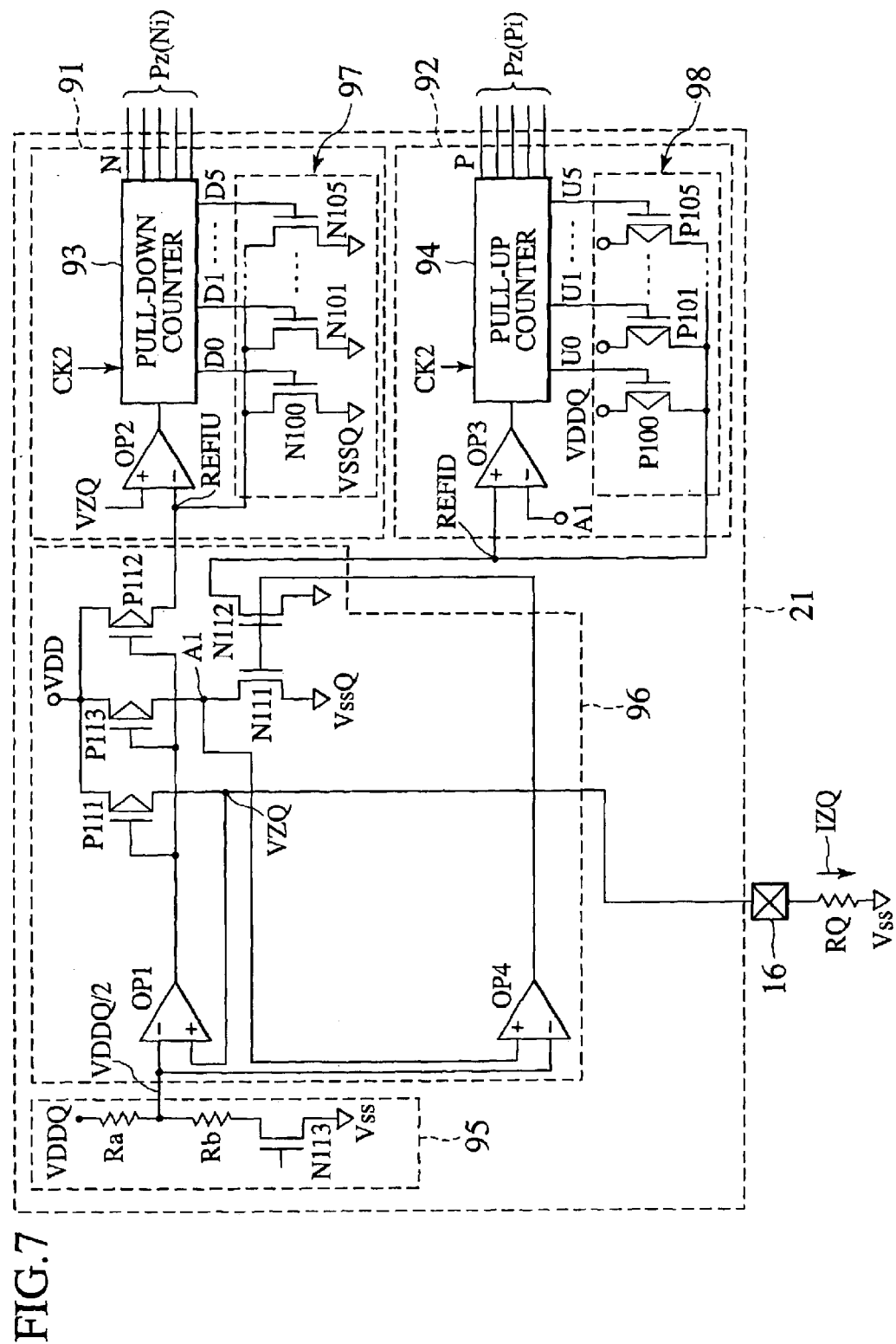
FIG. 7 is a detailed circuit diagram showing the buffer size decision circuit illustrated in FIG. 4.

As shown in FIG. 7, the buffer size decision circuit 21 includes a pull-down controller 91 providing buffer size signals Pz (N0) to Pz (N4) which determines the buffer size of the pull-down output transistor group 60b in FIG. 6, a pull-up controller 92 providing buffer size signals Pz (P0) to Pz (P4) which determines the buffer size of the pull-up output transistor group 60a in FIG. 6, a reference voltage generator 95 which generates a reference voltage for determining the buffer size, and a comparator 96 which compares the reference voltage and the voltage VZQ of the external terminal 12. The "reference voltage" is equal to half of the first high-level power supply voltage VDDQ.

The reference voltage generator 95 includes resistors Ra and Rb and an n-MOS transistor N113, which are connected in series. The first high-level power supply voltage VDDQ is applied to the resistor Ra, and a second low-level power supply voltage VssQ (VssQ=Vss) is applied to a source electrode of the n-MOS transistor N113.

The comparator 96 includes operational amplifiers OP1 and OP4, each having an inverting and a non-inverting input terminals, the reference voltage VDDQ/2 is supplied to the inverting input terminals, p-MOS transistors P111 to P113 respectively having gate electrodes connected to an output terminal of the operational amplifier OP1, and n-MOS transistors N111 and N112 respectively having gate electrodes connected to an output terminal of the operational amplifier OP4. A drain electrode of the p-MOS transistor P111 is connected to the external terminal 16 and to a non-inverting input terminal of the operational amplifier OP1. A drain electrode of the p-MOS transistor P113 is connected to a drain electrode of the n-MOS transistor N111 and to a non-inverting input terminal of the operational amplifier OP4. A second high-level power supply voltage VDD is applied to source electrodes of the p-MOS transistors P111 to P113. The second low-level power supply voltage VssQ is applied to source electrodes of the n-MOS transistors N111 and N112.

The pull-down controller 91 includes an operational amplifier OP2, of which an inverting input terminal is connected to a node REFIU, a pull-down counter 93 connected to an output terminal of the operational amplifier OP2, and a pull-down dummy buffer 97 connected to the pull-down counter 93. The pull-down dummy buffer 97 includes six n-MOS transistors N100 to N105 connected in parallel. A voltage VZQ at the external terminal 16 is applied to a non-inverting input terminal of the operational amplifier OP2. The pull-down counter 93 is connected to respective gate electrodes of the n-MOS transistors N100 to N105. The first low-level power supply voltage VSSQ is applied to source electrodes of the n-MOS transistors N100 to N105. Drain electrodes of the n-MOS transistors N100 to N105 are fed back to the inverting input terminal of the operational amplifier OP2.

The pull-down dummy buffer 97 has either circuit configurations similar to the pull-down output transistor group 60b, or circuit configurations in which transistor sizes are obtained by multiplying the respective transistor sizes in the pull-down output transistor group 60b by a constant. Specifically, the n-MOS transistors N100 to N105 have channel widths equal to $2^0$, $2^1$, $2^2$, $2^3$, $2^4$ and $2^5$ times a unit channel width, respectively. The pull-down counter 93 operates in accordance with the second clock signal CK2.

The pull-up controller 92 includes an operational amplifier OP3, a non-inverting input terminal of which is connected to a node REFID, a pull-up counter 94 connected to an output terminal of the operational amplifier OP3, and a pull-up dummy buffer 98 connected to the pull-up counter 94. The pull-up dummy buffer 98 includes six p-MOS transistors P100 to P105 connected in parallel. A voltage at a node A1 is applied to an inverting input terminal of the operational amplifier OP3. The pull-up counter 94 is connected to respective gate electrodes of the p-MOS transistors P100 to P105. The first high-level power supply voltage VDDQ is applied to source electrodes of the p-MOS transistors P100 to P105. Drain electrodes of the p-MOS transistors P100 to P105 are fed back to the non-inverting input terminal of the operational amplifier OP3.

The pull-up dummy buffer 98 has either circuit configurations similar to the pull-up output transistor group 60a, or circuit configurations in which transistor sizes are obtained by multiplying the respective transistor sizes in the pull-up output transistor group 60a by a constant. Specifically, the p-MOS transistors P100 to P105 have channel widths equal to $2^0$, $2^1$, $2^2$, $2^3$, $2^4$ and $2^5$ times a unit channel width, respectively. The pull-up counter 94 operates in accordance with the second clock signal CK2.

Next, description will be made regarding an operation of the memory chip 11 according to the first embodiment of the present invention with reference to FIGS. 3 to 7.

As shown in FIG. 3, the address signal, which is transmitted via the data bus 13 from MPU 14 of FIG. 1, is firstly supplied from the address terminal 36 and is transferred to the row and column selectors 32 and 33 via the address buffer 37. Based on this address signal, a desired memory cell in the memory array 31 is selected. In the event of data writing, input data supplied from the I/O terminal 12 are transferred to the write buffer 35 via the input buffer unit 39 and written in the desired memory cell in the memory array 31. However, in the event of data reading, a first output data signal DA1 read out of a selected memory cell is transferred to the output buffer unit 40 via the sense amplifier 34 and outputted from the output buffer unit 40 to the outside of the memory chip 11 via the I/O terminal 12. Meanwhile, the timing control signal is supplied from the timing control circuit 41 to the row selector 32, the column selector 33, the sense amplifier 34 and the write buffer 35 via the timing buffer 42, and the operation timing upon writing or reading is thereby controlled.

As shown in FIG. 4, the first output data signal DA1, which is read out of the desired memory cell in the memory array 31 in FIG. 3, is fed into the output register 53 synchronously with the inverted clock signal CK' of the first clock signal CK1. Then, the second output data signal DA2 is transferred from the output register 53 toward the impedance adjustment circuit 54 synchronously with the first clock signal CK1. Meanwhile, the buffer size signals Pz (Pi) and Pz (Ni) are supplied from the buffer size decision circuit 21 synchronously with the second clock signal CK2. Then, the buffer size signals Pz (Pi) and Pz (Ni) are amplified by the intermediate buffer 51a and supplied to the impedance adjustment circuit 54. Thereafter, the impedance adjustment circuit 54 adjusts the buffer size of the PI buffer 52 based on the buffer size signals Pz (Pi) and Pz (Ni) as well as the second output data signal DA2. The second output data signal DA2 is further transferred through the PI buffer 52 to the outside of the memory chip 11 via the I/O terminal 12.

As shown in FIG. 5, the first output data signal DA1 being transferred to the transfer gate 135 passes through the transfer gate 135 when the first clock signal CK1 is at a first level (a high level). The first output data signal DA1 does not pass through the transfer gate 135 when the first clock signal CK1 is at a second level (a low level), which is opposite to the first level. The first output data signal DA1 which has passed through the transfer gate 135 is then held by the latch circuit 137, and is supplied to the transfer gate 136 simultaneously. The first output data signal DA1 supplied to the transfer gate 136 passes through the transfer gate 136 when the first clock signal CK1 is at a low level, but does not pass through the transfer gate 136 when the first clock signal CK1 is at a high level. The first output data signal DA1 which has passed through the transfer gate 136 is then held by the latch circuit 138, and is outputted as the second output data signal DA2 simultaneously. The first output data signal DA1 is inverted each time it passes through the two transfer gates 135 and 136 and the two latch circuits 137 and 138. In this way, the output register 53 can convert the first output data signal DA1 synchronized with the inverted clock signal CK', into the second output data signal DA2 synchronized with the first clock signal CK1.

As shown in FIG. 7, the reference voltage (VDDQ/2) is supplied from a connection point of the resistors Ra and Rb to the comparator 96, by controlling a gate voltage of the n-MOS transistor N113.

In FIG. 7, the operational amplifier OP1 controls gate voltages of the p-MOS transistors P111 to P113, so that the voltage VZQ at the external terminal 16 is set to the reference voltage (VDDQ/2). Accordingly, the voltage at the node REFIU connected to the drain electrode of the p-MOS transistor P112, and the voltage at the node A1 connected to the drain electrode of the p-MOS transistor P113 are also set to the reference voltage (VDDQ/2). Moreover, the operational amplifier OP4 controls gate voltages of the n-MOS transistors N111 and N112, so that the voltage at the node A1 is set to the reference voltage (VDDQ/2). Accordingly, the voltage at the node-REFID connected to the drain electrode of the n-MOS transistor N112 is also set to the reference voltage (VDDQ/2).

The pull-down counter 93 selectively controls turning on and off of the n-MOS transistors N100 to N105 based on output signals D0 to D5, so that the voltage at the node REFIU coincides with the voltage VZQ at the external terminal 16. Then, the pull-down counter 93 supplies the buffer size signal Pz (Ni) based on the output signals D0 to D5.

The pull-up counter 94 selectively controls the turning on and off of the p-MOS transistors P100 to P105 based on output signals U0 to U5, so that the voltage at the node REFID coincides with the voltage at the node A1. Then, the pull-up counter 94 supplies the buffer size signal Pz (Pi) based on the output signals U0 to U5.

As has been described above, the buffer size decision circuit 21 determines the buffer size signals Pz (Pi) and Pz (Ni) on the basis of the external resistor RQ, and changes the buffer size signals Pz (Pi) and Pz (Ni) based on the second clock signal CK2. By connection of the external resistor RQ to the external terminal 16, where the external resistor RQ is for determining the impedance that needs to be matched, the buffer size decision circuit 21 can automatically search for the buffer size signals Pz (Pi) and Pz (Ni) in order that the buffer size of the PI buffer 52 is set to a value equal to the resistance of the external resistor RQ or a value obtained by multiplying the resistance of the external resistor RQ by a constant.

Next, description will be made regarding operations of the PI buffer 52 and the impedance adjustment circuit 54 shown in FIG. 6. First, description will be made regarding control of the impedance of the pull-up output transistor group 60a.

When the second output data signal DA2 is at a low level, the NAND circuit 67 supplies a high level irrelevant to the level of the buffer size signals Pz (Pi: i=0 to 5) held by the first latch circuit 63. Accordingly, the corresponding p-channel MOS transistor Pi (i=0 to 5) connected to the NAND circuit 67 is set to an off state.

When the second output data signal DA2 is at a high level, the NAND circuit 67 supplies a low level if the specific buffer size signal Pz (Pi) held by the first latch circuit 63 is at a high level. Accordingly, the corresponding p-channel MOS transistor Pi connected to the NAND circuit 67 is selectively set to an on state. On the contrary, the NAND circuit 67 supplies a high level if the buffer size signal Pz (Pi) held by the first latch circuit 63 is at a low level. Accordingly, the p-channel MOS transistor Pi connected to the NAND circuit 67 is selectively set to the off state.

In this way, when the second output data signal DA2 is at a high level, the first switch 65 is closed so as to avoid change of the buffer size signal Pz (Pi) which is held by the first latch circuit 63. Because, the output of the NAND circuit 67 may vary in accordance with the level of the corresponding buffer size signal Pz (Pi) if the first switch 65 is open, whereby a noise may be included in the output of the PI buffer 52.

On the contrary, when the second output data signal DA2 is at a low level, the first switch 65 is made open so as to effectuate the changing of the buffer size signal Pz (Pi) which is held by the first latch circuit 63. This is because the NAND circuit 67 can constantly supply a high level without fluctuation if the second output data signal DA2 is at a low level. Here, it is important that the buffer size of the pull-up output transistor group 60a is adjusted before the second output data signal DA2 changes from a low level to a high level.

Next, description will be made regarding control of the impedance of the pull-down output transistor group 60b.

When the second output data signal DA2 is at a high level, the NOR circuit 68 supplies a low level irrelevant to the level of the buffer size signal Pz (Ni) held by the second latch circuit 64. Accordingly, the n-channel MOS transistor Ni connected to the NOR circuit 68 is set to an off state.

When the second output data signal DA2 is at a low level, the NOR circuit 68 supplies a high level if the buffer size signal Pz (Ni) held by the second latch circuit 64 is at a low level. Accordingly, the n-channel MOS transistor Ni connected to the NOR circuit 68 is set to an on state. On the contrary, the NOR circuit 68 supplies a low level if the buffer size signal Pz (Ni) held by the second latch circuit 64 is at a high level. Accordingly, the n-channel MOS transistor Ni connected to the NOR circuit 68 is set to the off state.

In this way, when the second output data signal DA2 is at a low level, the second switch 66 is closed so as to avoid change of the buffer size signal Pz (Ni) which is held by the second latch circuit 64. Because, the output of the NOR circuit 68 may vary in accordance with the level of the buffer size signal Pz (Ni) if the second switch 66 is open, whereby a noise may be included in the output of the PI buffer 52.

On the contrary, when the second output data signal DA2 is at a high level, the second switch 66 is made open so as to effectuate updating of the buffer size signal Pz (Ni) which is held by the second latch circuit 64. Because, the NOR circuit 68 can constantly supply a low level without fluctuation if the second output data signal DA2 is at a high level. Here, it is important that the buffer size of the pull-down output transistor group 60b is adjusted before the second output data signal DA2 changes from a high level to a low level.

As described above, the buffer size signals Pz (Pi) and Pz (Ni), which are held respectively by the first and second latch circuits 63 and 64, are adjusted in response to the level of the second output data signal DA2. Part of the p-channel MOS transistors P0 to P5 and the n-channel MOS transistors N0 to N5 remain closed in accordance with the buffer size signals Pz (Pi) and Pz (Ni), which are held respectively by the first and second latch circuits 63 and 64. Therefore, the impedance adjustment circuit 54 can change the buffer size of the PI buffer 52 based on the buffer size signals Pz (Pi) and Pz (Ni), in response to the level of the second output data signal DA2.

As it has been described above, the memory chip according to the first embodiment of the present invention can adjust the buffer size of the PI buffer 52 in response to the second output data signal DA2 even in the case of continuous reading operations. Therefore, it is possible to enhance accuracy in impedance matching. According to the first embodiment of the present invention, it is possible to enhance accuracy in impedance matching in programmable impedance circuit technology.

Second Embodiment

First, a problem of the first embodiment of the present invention will be described.

Figure 8:
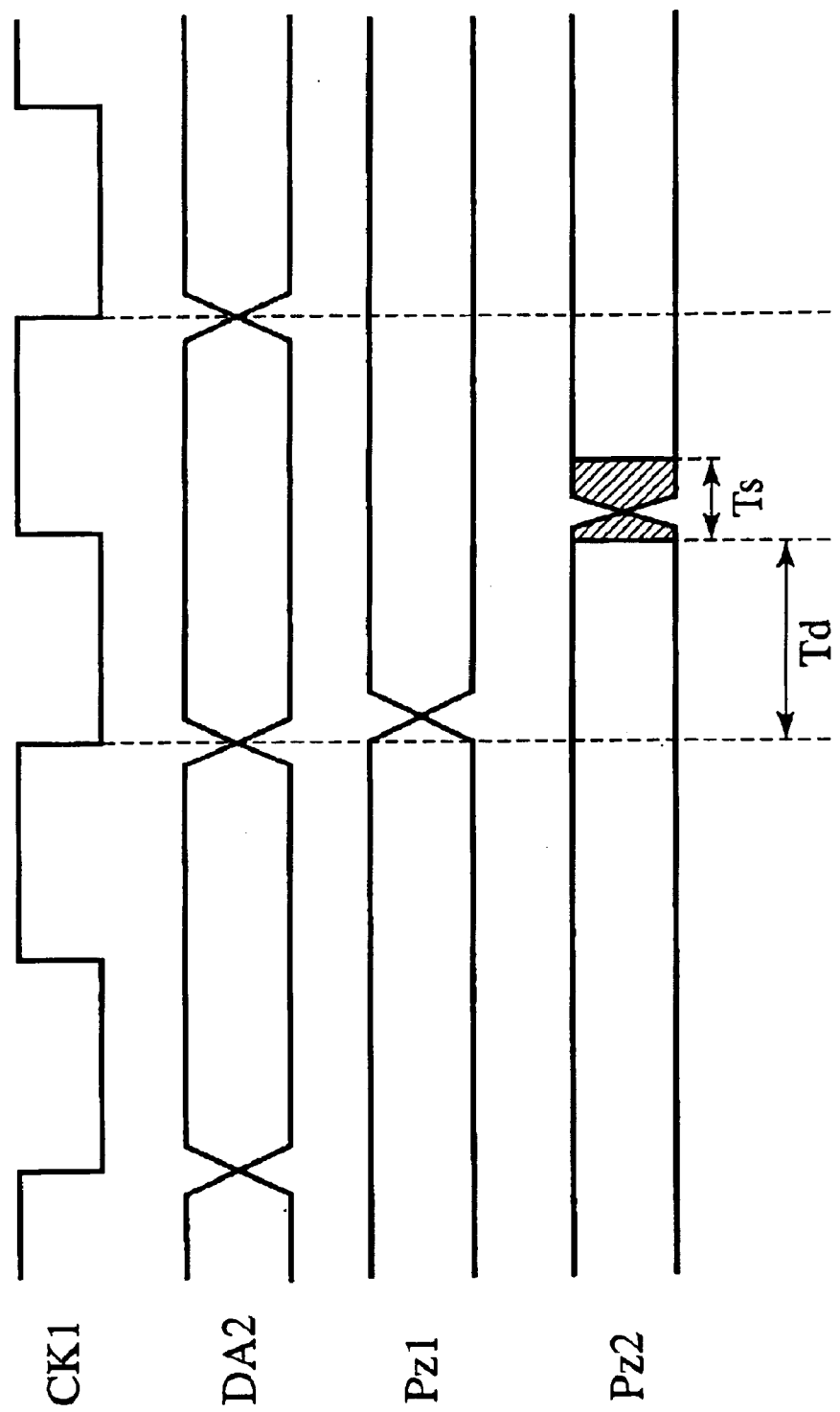
FIG. 8 is a timing chart showing an operation of the memory chip according to the first embodiment of the present invention.

As shown in FIG. 8, the second output data signal DA2 is changed synchronously with the first clock signal CK1. The buffer size signals Pz (Pi) and Pz (Ni) are changed synchronously with the second clock signal CK2. Since the second clock signal CK2 is synchronized with the first clock signal CK1, the buffer size signals Pz (Pi) and Pz (Ni) are changed synchronously with the first clock signal CK1 as well. In FIG. 8, reference code Pz1 denotes the buffer size signals Pz (Pi) and Pz (Ni) at the time of being transferred from the buffer size decision circuit 21. As shown in FIG. 2, long wiring is provided for connection from the buffer size decision circuit 12 to the data output units 22a, 22b and so on which includes the PI buffers 52. Accordingly, it is likely that a wiring delay occurs due to resistance and inductance of the wiring or due to parasitic capacitance. Therefore, the buffer size signals Pz (Pi) and Pz (Ni) are transferred to the PI buffer 52 after passage of a certain delay period Td. In FIG. 8, reference code Pz2 denotes the buffer size signals Pz (Pi) and Pz (Ni) at the time of being transferred to the PI buffer 52. A certain skew period Ts exists before or after the changing of the buffer size signals Pz (Pi) and Pz (Ni), in which the buffer size signals Pz (Pi) and Pz (Ni) go into unstable conditions.

FIG. 8 shows the case where the total period of the delay period Td from the buffer size decision circuit 21 to the PI buffer 52 and the skew period Ts is shorter than a clock cycle of the first clock signal CK1. In FIG. 8, the second output data signal DA2 does not change when the first and second latch circuits 63 and 64 import the buffer size signals Pz (Pi) and Pz (Ni). That is, the second output data signal DA2 does not change during the buffer size updating.

Figure 9:
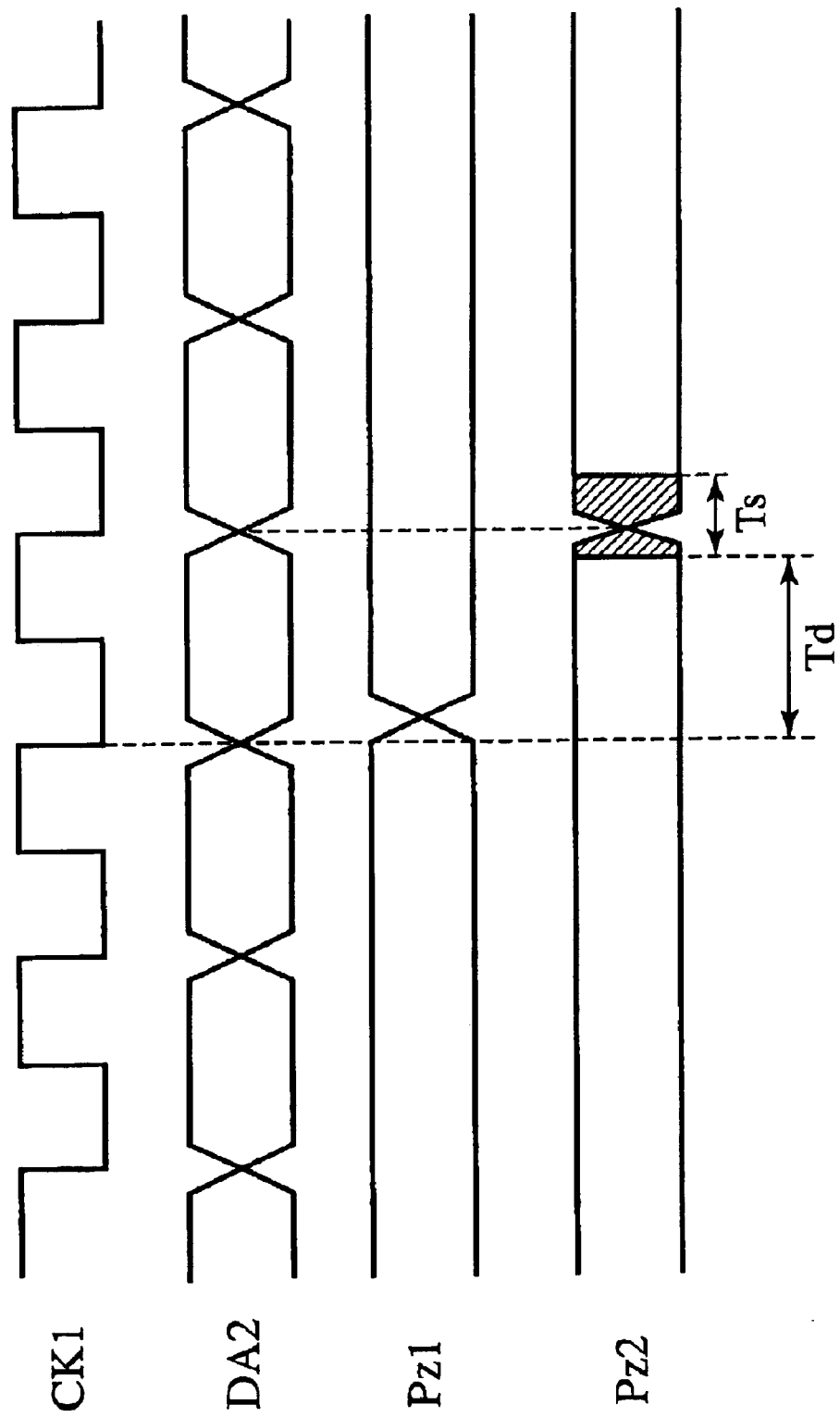
FIG. 9 is another timing chart showing an operation of the memory chip according to the first embodiment of the present invention.

FIG. 9 shows the case where the total period of the delay period Td and the skew period Ts is longer than the clock cycle of the first clock signal CK1. When the clock frequency of the first clock signal CK1 is increased, the total period of the delay period Td and the skew period Ts cannot stay within the clock frequency of the first clock signal CK1. Therefore, as shown in FIG. 9, the second output data signal DA2 changes during the buffer size updating. In FIG. 9, the first and second latch circuits 63 and 64 may hold part of the buffer size signals Pz (Pi) and Pz (Ni) erroneously, thus inhibiting normal buffer size updating. In other words, if the buffer size is changed during a changing period of the second output data signal DA2, there is a risk of abnormal updating of the buffer size attributable to erroneous holding of part of the buffer size signals Pz (Pi) and Pz (Ni).

Particularly, in the Dual-Data-Rate (DDR) mode, the data output changes at both rising edge and trailing edge of the clock signal. Accordingly, an allowable period for updating the buffer size is limited to a half cycle of the clock, which further rigidifies timing conditions.

In consideration of the above, a second embodiment of the present invention will be described below with reference to FIG. 10 to FIG. 21.

Figure 10:
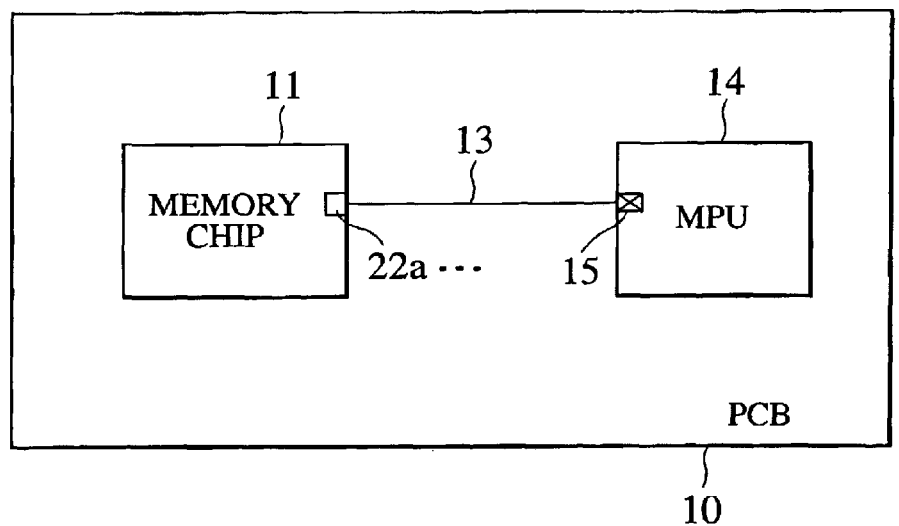
FIG. 10 is a plan view showing a configuration example of a semiconductor device according to a second embodiment of the present invention.

As shown in FIG. 10, a semiconductor device according to the second embodiment of the present invention includes a PCB 10, a memory chip 11 mounted on the PCB 10, an MPU 14 connected to the memory chip 11. A data output unit 22a in the memory chip 11 is connected via a data bus 13 to an input terminal 15 in the MPU 14 placed on the PCB 10.

Figure 11:
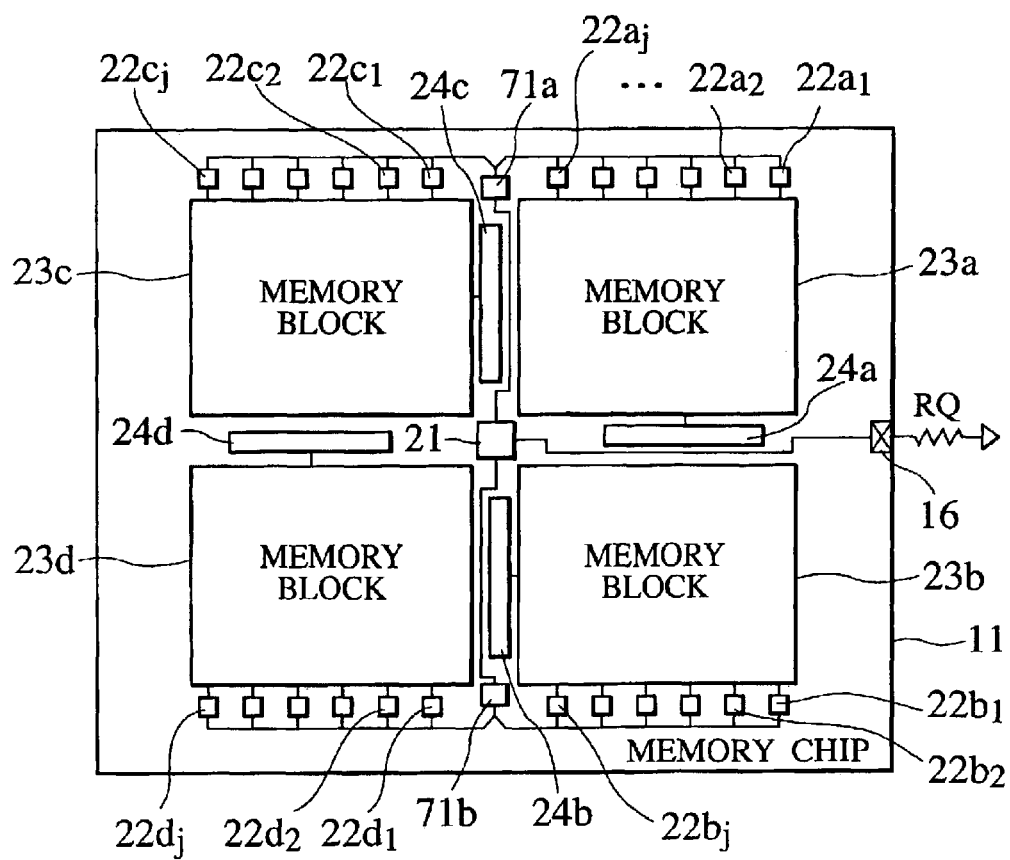
FIG. 11 is a plan view showing a layout example of the memory chip illustrated in FIG. 10.

As shown in FIG. 11, the memory chip 11 includes four memory blocks 23a to 23d, for example, four timing/address units 24a to 24d connected to the memory blocks 23a to 23d, a plurality of data output units $22a_1, 22a_2, ---, 22a_j; 22b_1, 22b_2, ---, 22b_j; 22c_1, 22c_2, ---, 22c_j; 22d_1, 22d_2, ---, 22d_j;$ which are connected respectively to the memory blocks 23a to 23d, an intermediate buffer unit 71a connected to the respective data output units $22a_1, 22a_2, ---, 22a_j; 22c_1, 22c_2, ---, 22c_j$, another intermediate buffer unit 71b connected to the respective data output units $22b_1, 22b_2, ---, 22b_j; 22d_1, 22d_2, ---, 22d_j$, a buffer size decision circuit 21 connected to the intermediate buffer units 71a and 71b, and an external terminal 16 connected to the buffer size decision circuit 21. The four memory blocks 23a to 23d are disposed evenly in the form of a 2×2 matrix, and the data output units intermediate buffer unit 71a connected to the respective data output units $22a_1, 22a_2, ---, 22a_j$ and so on are disposed linearly in spaces between the periphery of the memory chip 11 and the memory blocks 23a to 23b. The buffer size decision circuit 21 is disposed in the middle position of the four memory blocks 23a to 23d, i.e. in the center of the memory chip 11. An external resistor RQ is connected to the external terminal 16. The timing/address units 24a to 24d are disposed between the memory blocks 23a to 23d. The number of the memory blocks 23a to 23d is not limited to four: the number may be in a range from one to three or larger than four. Moreover, the number (j) of the data output units $22a_1, 22a_2, ---, 22a_j$ and so on corresponds to the capacity of the data bus 13. Specifically, if the data bus 13 in FIG. 10 has the capacity of k bits, then the corresponding number (j) of the data output units $22a_1, 22a_2, ---, 22a_j$ and so on has the relation k=j.

Figure 12:
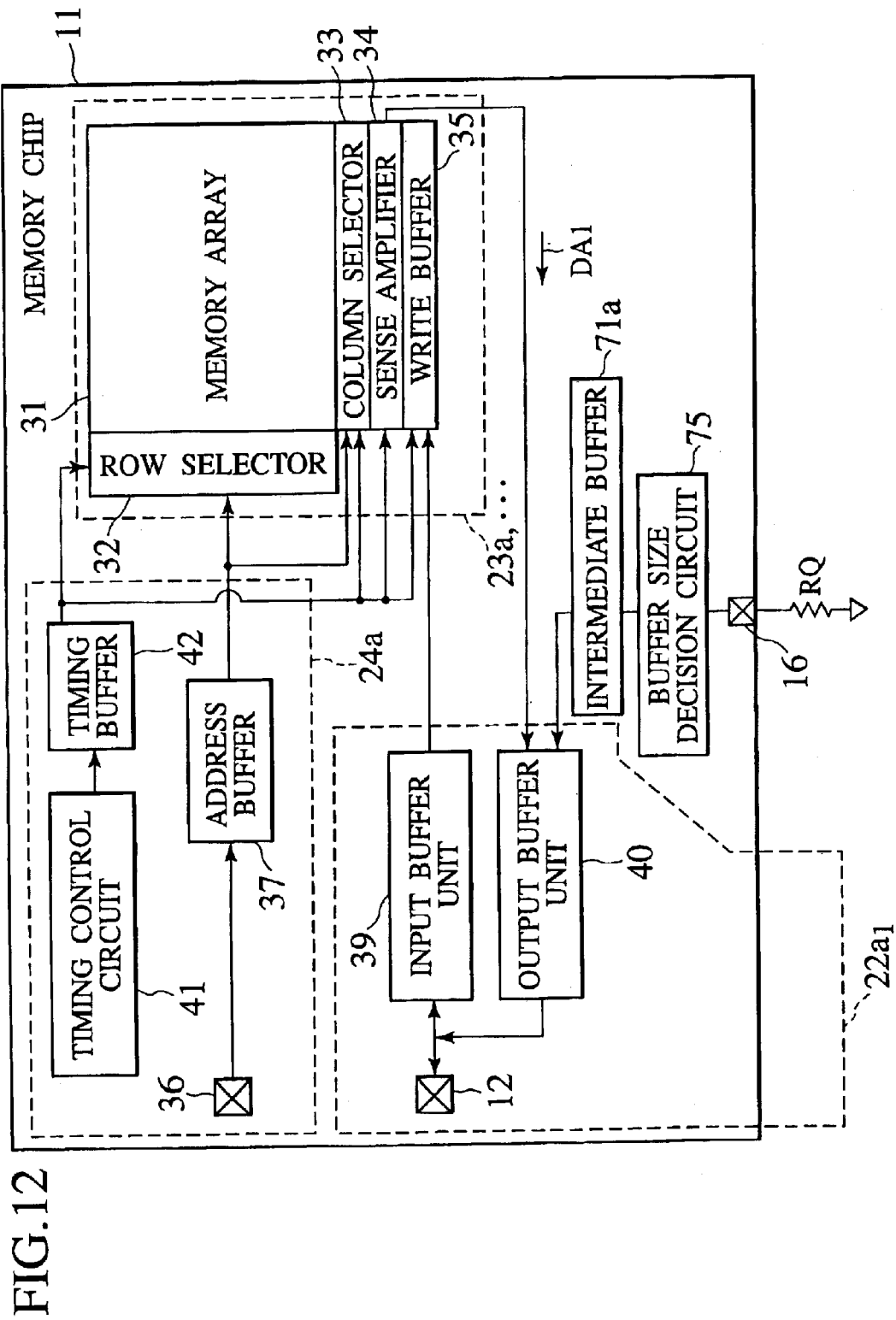
FIG. 12 is a block diagram showing a configuration of the memory chip illustrated in FIG. 10.

To facilitate explanation, only the memory block 23a in FIG. 11 is shown in FIG. 12. Namely, the memory block 23a includes a memory array 31 having a plurality of memory cells disposed in the form of a matrix, a row selector 32 and a column selector 33 connected to the memory array 31, a sense amplifier 34 connected to the column selector 33, a write buffer 35 connected to the sense amplifier 34. As shown in FIG. 12, the memory block 23a is disposed on the memory chip 11. The memory chip 11 further includes the timing/address unit 24a and the data output unit $22a_1$. The timing/address unit 24a includes an address terminal 36 to which an address signal is transferred, an address buffer 37 connected in a space between the address terminal 36 and the row selector 32 as well as the column selector 33, a timing control circuit 41 which controls operation timing in the event of writing or reading, and a timing buffer 42 connected in a space between the timing control circuit 41 and the row selector 32, column selector 33, the sense amplifier 34 and the write buffer 35. The data output unit $22a_1$ includes an I/O terminal 12 connected to the data bus 13 in FIG. 10, an input buffer unit 39 connected between the I/O terminal 12 and the write buffer 35, an output buffer unit 40 connected between the I/O terminal 12 and the sense amplifier 34. To avoid cluttering up the drawing, the illustration of other data output unit $22b_1, 22b_2, ---, 22b_j$ connected to the memory block 23a is omitted. The memory chip 11 further includes an intermediate buffer unit 71a connected to the output buffer unit 40, a buffer size decision circuit 75 connected to the intermediate buffer unit 71a, the external terminal 16 connected to the buffer size decision circuit 75. The external resistor RQ is connected to the external terminal 16. Here, it is to be noted that the locations of the respective constituents in FIG. 12 are different from an actual configuration thereof. As described above, the memory chip 11 shown in FIG. 12 includes the buffer size decision circuit 75 instead of the buffer size decision circuit 21 shown in FIG. 3.

As stated above, to facilitate explanation, FIG. 12 does not illustrate other memory blocks 23b to 23d. Also, the illustration of the data output units $22b_1, 22b_2, ---, 22b_j; 22c_1, 22c_2, ---, 22c_j; 22d_1, 22d_2, ---, 22d_j$ and taming/address units 24b to 24d, which are shown in FIG. 11, are omitted. Other memory blocks 23b to 23d have a configuration similar to the memory block 23a shown in FIG. 12. Meanwhile, other data output units $22b_1, 22b_2, ---, 22b_j$ and so on have the configuration similar to the data output unit $22a_1$ shown in FIG. 12. Other timing/address units 24b to 24d have the configuration similar to the timing/address unit 24a shown in FIG. 12

To facilitate explanation, FIG. 12 illustrates only one address terminal 36 and one address buffer 37. However, actual address signals include n bits of row address signals and m bits of column address signals. Accordingly, n+m address terminals 36 actually exist, and the address buffer 37 includes n row address buffers and m column address buffers. Then, the n row address buffers are connected to the row selector 32, and the m column address buffers are connected to the column selector 33.

To facilitate explanation, FIG. 12 illustrates only one I/O terminal 12, one input buffer unit 39, and one output buffer unit 40. However, if the capacity of the data bus 13 in FIG. 10 accounts for j bits, then k I/O terminals 12, j input buffer units 39, and j output buffer units 40 actually exist.

Figure 13:
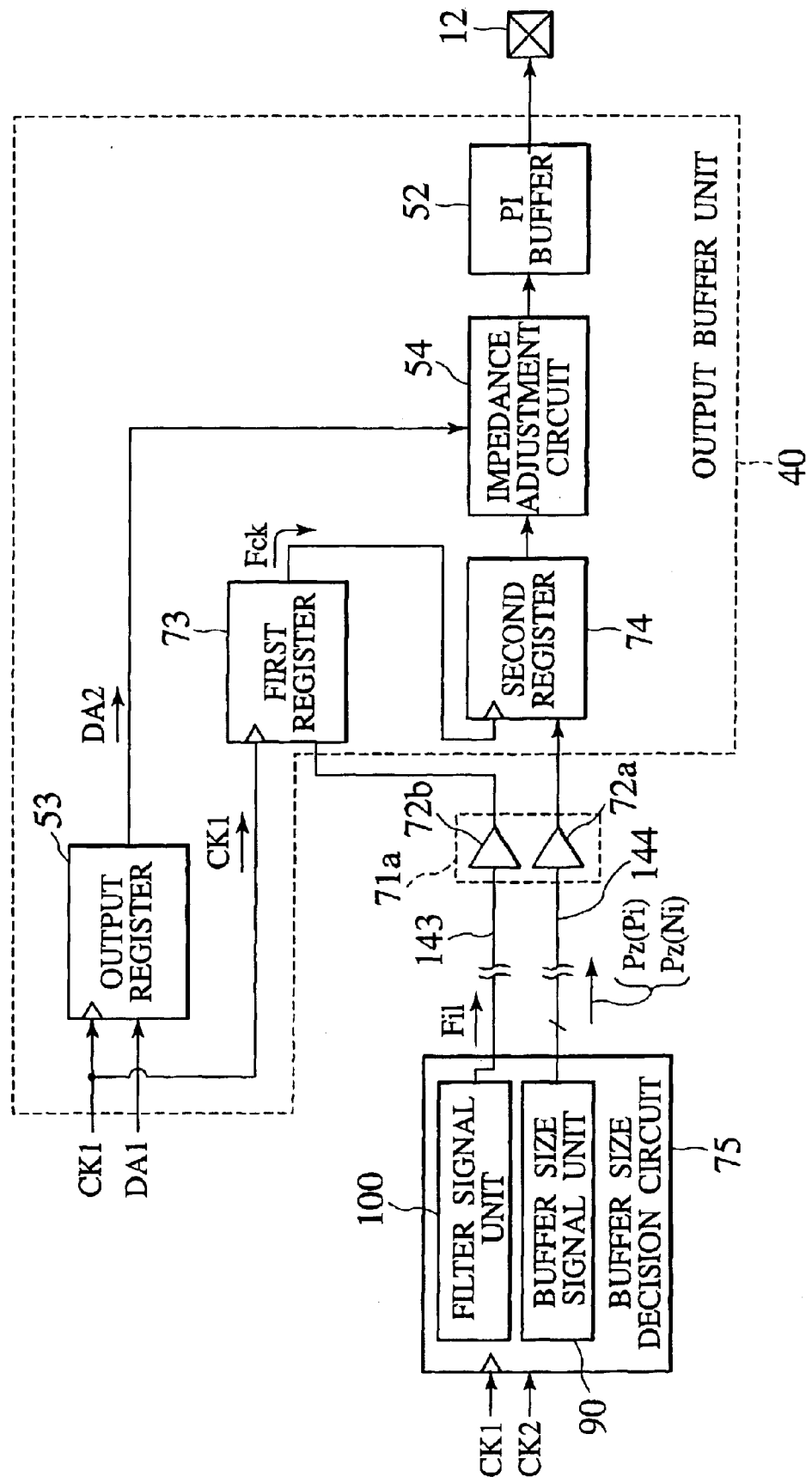
FIG. 13 is a block diagram showing an output buffer unit and a buffer size decision circuit illustrated in FIG. 12.

With reference to FIG. 13, description will be made regarding the configurations of the output buffer unit 40, the buffer size decision circuit 75 and intermediate buffer unit 71a of the memory chip 11 shown in FIG. 12. The output buffer unit 40 includes an output register 53 to which a first output data signal DA1 being transferred from the sense amplifier 34 in FIG. 12 is supplied, an impedance adjustment circuit 54 connected to the output register 53, a PI buffer 52 connected to the impedance adjustment circuit 54, a first register 73 to which a first clock signal CK1 is supplied, and a second register 74 connected to the first register 73. The PI buffer 52 is connected to the I/O terminal 12. The second register 74 is connected to the impedance adjustment circuit 54.

The intermediate buffer unit 71a includes a first intermediate buffer 72a and second intermediate buffer 72b.

The buffer size decision circuit 75 includes a buffer size signal unit 90 which generates buffer size signals Pz (Pi) and Pz (Ni) for determining the buffer size of the PI buffer 52, and a filter signal unit 100 which generates a first filter signal Fil to be set to a first level (a low level) for a certain period before and after chage of the buffer size signals Pz (Pi) and Pz (Ni). The buffer size signal unit 90 is connected to the second register 74 via the first intermediate buffer 72a. The filter signal unit 100 is connected to the first register 73 via the second intermediate buffer 72b. First wiring 143 for connecting the first signal unit 100 to the first register 73, and second wiring 144 for connecting the buffer size signal unit 90 to the second register 74, have almost the same wiring delay amounts. The first wiring 143 includes wiring for connecting the filter signal unit 100 to the second intermediate buffer 72b, and wiring for connecting the second intermediate buffer 72b to the first register 73. The second wiring 144 includes wiring for connecting the buffer size signal unit 90 to the first intermediate buffer 72a, and wiring for connecting the first intermediate buffer 72a to the second register 74.

The buffer size signal unit 90 generates the buffer size signals Pz (Pi) and Pz (Ni), changes the buffer size signals Pz (Pi) and Pz (Ni) synchronously with a second clock signal CK2, and transfers the buffer size signals Pz (Pi) and Pz (Ni) to the first intermediate buffer 72a. The first intermediate buffer 72a amplifies the buffer size signals Pz (Pi) and Pz (Ni) being transferred from the buffer size signal unit 90 and then transfers the buffer size signals Pz (Pi) and Pz (Ni) to the second register 74.

The filter signal unit 100 generates the first filter signal Fil and transfers the first filter signal Fil to the second intermediate buffer 72b. Here, the first filter signal Fil is set to the first level (a low level) only in the certain period before and after the changing of the buffer size signals Pz (Pi) and Pz (Ni) and is set to a second level (a high level) opposed to the first level in other periods. In other words, the first filter signal Fil is a pulse signal which is at a low level only in the certain period before and after updating of the buffer size signals Pz (Pi) and Pz (Ni) by the buffer size signal unit 90. Therefore, the certain period before and after the changing of the buffer size signals Pz (Pi) and Pz (Ni) corresponds to a pulse width of the first filter signal Fil. Note that the pulse width of the first filter signal Fil may be satisfactorily provided as plural cycles of the first clock signal CK1. Here, the pulse width of the first filter signal Fil is set equivalent to four cycles of the first clock signal CK1. When the filter signal Fil is at a low level, updating of the buffer size is prevented.

The first register 73 converts the first filter signal Fil into a second filter signal Fck synchronously with the first clock signal CK1. The second register 74 registers the buffer size signals Pz (Pi) and Pz (Ni) in the period when the second filter signal Fck is at a high level. The impedance adjustment circuit 54 adjusts the buffer size of the PI buffer 52 based on the buffer size signals Pz (Pi) and Pz (Ni) being registered in the second register 74 in accordance with the level of the second output data signal DA2.

Figure 14:
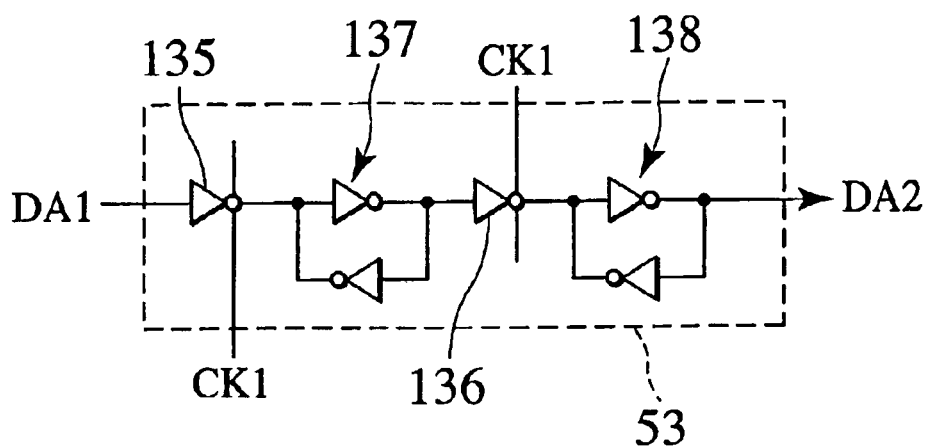
FIG. 14 is a circuit diagram showing an output register illustrated in FIG. 13.

As shown in FIG. 14, the output register 53 includes two transfer gates 135 and 136 which open and close in response to the level of the first clock signal CK1, and two latch circuits 137 and 138. The two transfer gates 135 and 136 are disposed alternately with the two latch circuits 137 and 138 connected in series.

Figure 15:
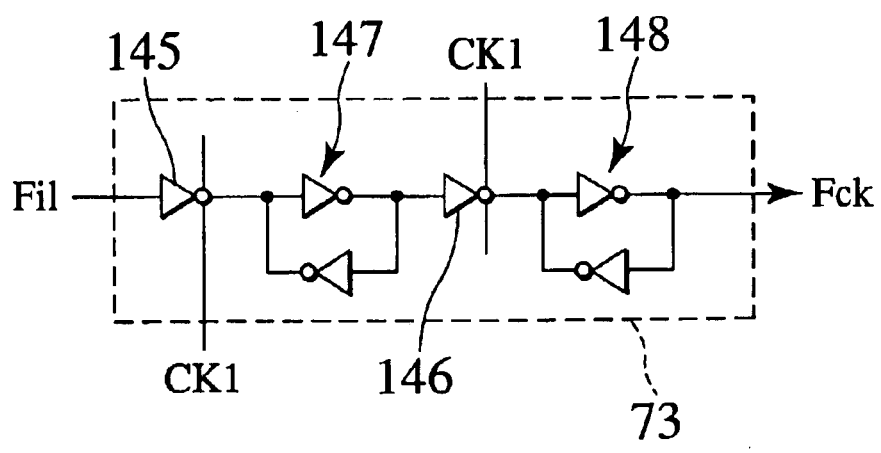
FIG. 15 is a circuit diagram showing a first register illustrated in FIG. 13.

As shown in FIG. 15, the first register 73 includes two transfer gates 145 and 146 which open and close in response to the level of the first clock signal CK1, and two latch circuits 147 and 148. The two transfer gates 145 and 146 are disposed alternately with the two latch circuits 147 and 148 connected in series.

Figure 16:
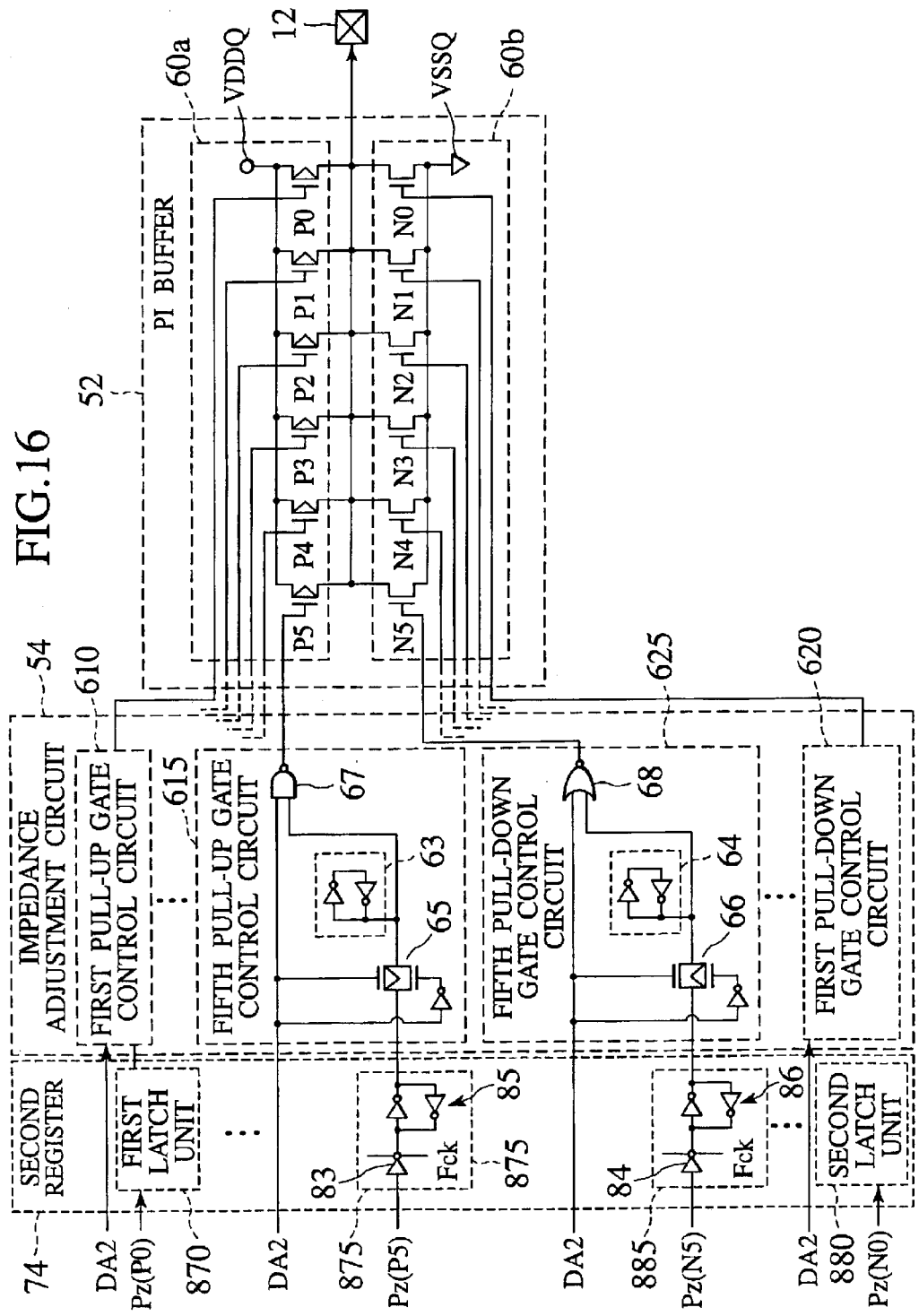
FIG. 16 is a detailed circuit diagram showing the programmable impedance buffer, an impedance adjustment circuit, and a second register, which are illustrated in FIG. 13.

With reference to FIG. 16, description will be made regarding the PI buffer 52, the impedance adjustment circuit 54, and the second register 74 which are shown in FIG. 13. The PI buffer 52 includes a pull-up output transistor group 60a and a pull-up output transistor group 60b. The pull-up output transistor group 60a includes six p-channel MOS transistors P0 to P5 connected in parallel. The pull-down output transistor group 60b includes six n-channel MOS transistors N0 to N5 connected in parallel. All drain electrodes of the p-channel MOS transistors P0 to P5 and all drain electrodes of the n-channel MOS transistors N0 to N5 are connected to the I/O terminal 12. A first high-level power supply voltage VDDQ is applied to all source electrodes of the p-channel MOS transistors P0 to P5. A first low-level power supply voltage VSSQ is applied to all source electrodes of the n-channel MOS transistors N0 to N5. Note that the first low-level power supply voltage VSSQ may be set to ground potential.

The impedance adjustment circuit 54 includes a plurality of pull-up gate control circuits 610 to 615 connected respectively to control electrodes of the p-channel MOS transistors P0 to P5, and a plurality of pull-down gate control circuits 620 to 625 connected respectively to control electrodes of the n-channel MOS transistors N0 to N5. The number of the first gate control circuits 610 to 615 is equal to the number of the p-channel MOS transistors P0 to P5, and the number of the second gate control circuits 620 to 625 is equal to the number of the n-channel MOS transistors N0 to N5.

The fifth pull-up gate control circuit 615 includes a first switch 65 to which the second output data signal DA2 is imported, a first latch circuit 63 connected to the second register 74 via the first switch 65, and a NAND circuit 67 to which the second output data signal DA2 and the buffer size signal Pz (P5) held by the first latch circuit 63 are transferred. An output terminal of the NAND circuit 67 is connected to the control electrode of the p-channel MOS transistor P5.

The fifth pull-down gate control circuit 625 includes a second switch 66 to which the second output data signal DA2 is imported, a second latch circuit 64 connected to the second register 74 via the second switch 66, and a NOR circuit 68 to which the second output data signal DA2 and the buffer size signal Pz (N5) held by the second latch circuit 64 are transferred. An output terminal of the NOR circuit 68 is connected to the control electrode of the n-channel MOS transistor N5.

Note that circuit configurations of first to fourth pull-up gate control circuits 610 to 614 and of first to fourth pull-down gate control circuits 620 to 624 are omitted in FIG. 16. However, the first to fourth pull-up gate control circuits 610 to 614 have circuit configurations similar to that of the fifth pull-up gate control circuit 615, and the first to fourth pull-down gate control circuits 620 to 624 have circuit configurations similar to that of the fifth pull-down gate control circuit 625. Each of the first to fourth pull-up gate control circuits 610 to 614 includes the first switch 65, the first latch circuit 63 connected to the second register 74 via the first switch 65, and the NAND circuit 67 to which the second output data signal DA2 and the buffer size signal Pz (P0) to Pz (P4) held by the first latch circuit 63 are transferred. The output terminal of each NAND circuit 67 is connected to the control electrode of the p-channel MOS transistor P0 to P4. Each of first to fourth pull-down gate control circuits 620 to 624 includes the second switch 66, the second latch circuit 64 connected to the second register 74 via the second switch 66, and the NOR circuit 68 to which the second output data signal DA2 and the buffer size signal Pz (N0) to Pz (N4) held by the second latch circuit 64 are transferred. The output terminal of each NOR circuit 68 is connected to the control electrode of the n-channel MOS transistor N0 to N4.

The second register 74 includes first latch units 870 to 875 connected respectively to the first to fifth pull-up gate control circuits 610 to 615, and second latch units 880 to 885 connected respectively to the first to fifth pull-down gate control circuits 620 to 625. The number of the first latch units 870 to 875 is equal to the number of the first gate control circuits 610 to 615 (six pieces), and the number of the second latch units 880 to 885 is equal to the number of the second gate control circuits 620 to 625 (six pieces).

The first latch unit 875 includes a transfer gate 83 to which the second filter signal Fck is supplied, and a third latch circuit 85 to which the buffer size signal Pz (P5) is supplied via the transfer gate 83. The third latch circuit 85 is connected to the first latch circuit 63 via the first switch 65. The transfer gate 83 opens when the second filter signal Fck is at a low level and closes when the second filter signal Fck is at a high level. The third latch circuit 85 imports the buffer size signal Pz (P5) when the second filter signal Fck is at a low level.

The second latch unit 885 includes a transfer gate 84 to which the second filter signal Fck is supplied, and a fourth latch circuit 86 to which the buffer size signal Pz (N5) is supplied via the transfer gate 84. The fourth latch circuit 86 is connected to the second latch circuit 64 via the second switch 66. The transfer gate 84 opens when the second filter signal Fck is at a low level and closes when the second filter signal Fck is at a high level. The fourth latch circuit 86 imports the buffer size signal Pz (N5) when the second filter signal Fck is at a low level.

Note that circuit configurations of other first latch units 870 to 874 and of other second latch units 880 to 884 are omitted in FIG. 16. However, the first latch units 870 to 874 have circuit configurations similar to that of the first latch unit 875, and the second latch units 880 to 884 have circuit configurations similar to that of the second latch unit 885. Each of the first latch units 870 to 874 includes the transfer gate 83 to which the second filter signal Fck is supplied, and the third latch circuit 85 to which the buffer size signal Pz (P0) to Pz (P4) is supplied via the transfer gate 83. Each third latch circuit 85 is connected to the first latch circuit 63 via the first switch 65. Each of the second latch units 880 to 884 includes the transfer gate 84 to which the second filter signal Fck is supplied, and the fourth latch circuit 86 to which the buffer size signal Pz (N0) to Pz (N4) is supplied via the transfer gate 84. Each fourth latch circuit 86 is connected to the second latch circuit 64 via the second switch 66.

Figure 17:
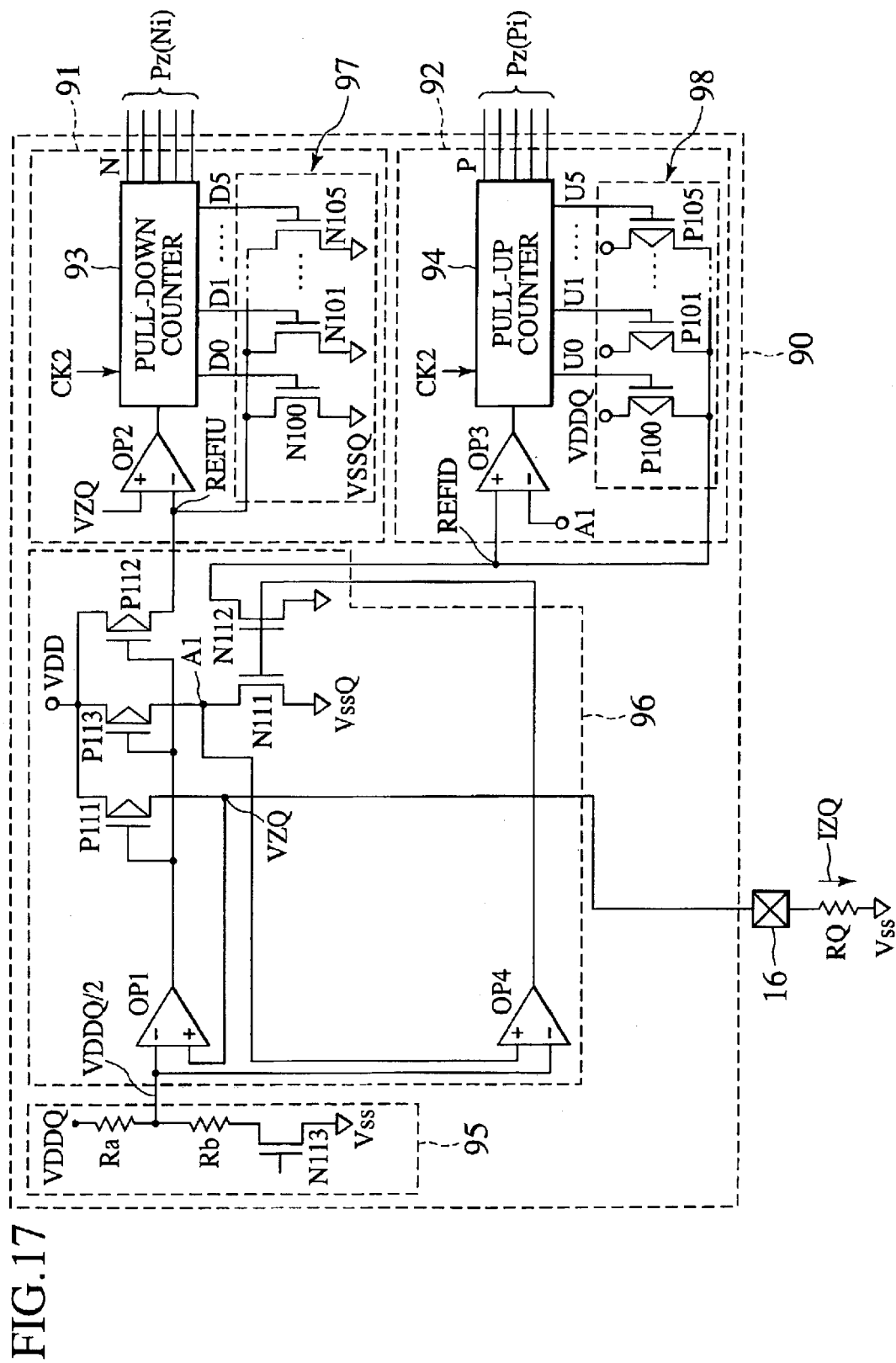
FIG. 17 is a detailed circuit diagram showing a buffer size signal unit illustrated in FIG. 13.

As shown in FIG. 17, the buffer size signal unit 90 includes a pull-down controller 91 which determines the buffer size of the pull-down output transistor group 60b in FIG. 16, a pull-up controller 92 which determines the buffer size of the pull-up output transistor group 60a in FIG. 16, a reference voltage generator 95 which generates a reference voltage for determining the buffer size, and a comparator 96 which compares the reference voltage and the voltage VZQ of the external terminal 12.

The reference voltage generator 95 includes a resistor Ra, a resistor Rb, and an n-MOS transistor N113, which are connected in series. The first high-level power supply voltage VDDQ is applied to the resistor Ra, and a second low-level power supply voltage VssQ (VssQ=Vss) is applied to a source electrode of the n-MOS transistor N113.

The comparator 96 includes an operational amplifier OP1 and an operational amplifier OP4, in which the reference voltage is supplied to inverting input terminals thereof, p-MOS transistors P111 to P113 having gate electrodes connected respectively to an output terminal of the operational amplifier OP1, and n-MOS transistors N111 and N112 having gate electrodes respectively connected to an output terminal of the operational amplifier OP4. A drain electrode of the p-MOS transistor P111 is connected to the external terminal 16 and to a non-inverting input terminal of the operational amplifier OP1. A drain electrode of the p-MOS transistor P113 is connected to a drain electrode of the n-MOS transistor N111 and to a non-inverting input terminal of the operational amplifier OP4. A second high-level power supply voltage VDD is applied to source electrodes of the p-MOS transistors P111 to P113. The second low-level power supply voltage VssQ is applied to source electrodes of the n-MOS transistors N111 and N112.

The pull-down controller 91 includes an operational amplifier OP2, of which an inverting input terminal is connected to a node REFIU, a pull-down counter 93 connected to an output terminal of the operational amplifier OP2, and a pull-down dummy buffer 97 connected to the pull-down counter 93. The pull-down dummy buffer 97 includes six n-MOS transistors N100 to N105 connected in parallel. A voltage VZQ at the external terminal 16 is applied to a non-inverting input terminal of the operational amplifier OP2. The pull-down counter 93 is connected to respective gate electrodes of the n-MOS transistors N100 to N105. The first low-level power supply voltage VSSQ is applied to source electrodes of the n-MOS transistors N100 to N105. Drain electrodes of the n-MOS transistors N100 to N105 are fed back to the inverting input terminal of the operational amplifier OP2.

The pull-down dummy buffer 97 includes either circuit configurations similar to the pull-down output transistor group 60b, or circuit configurations in which transistor sizes are obtained by multiplying the respective transistor sizes in the pull-down output transistor group 60b by a constant. Specifically, the n-MOS transistors N100 to N105 have channel widths equal to $2^0$, $2^1$, $2^2$, $2^3$, $2^4$ and $2^5$ times a unit channel width, respectively. The pull-down counter 93 operates in accordance with the second clock signal CK2.

The pull-up controller 92 includes an operational amplifier OP3, a non-inverting input terminal of which is connected to a node REFID, a pull-up counter 94 connected to an output terminal of the operational amplifier OP3, and a pull-up dummy buffer 98 connected to the pull-up counter 94. The pull-up dummy buffer 98 includes six p-MOS transistors P100 to P105 connected in parallel. A voltage at a node A1 is applied to an inverting input terminal of the operational amplifier OP3. The pull-up counter 94 is connected to respective gate electrodes of the p-MOS transistors P100 to P105. The first high-level power supply voltage VDDQ is applied to source electrodes of the p-MOS transistors P100 to P105. Drain electrodes of the p-MOS transistors P100 to P105 are fed back to the non-inverting input terminal of the operational amplifier OP3. The pull-up control 94 operates in accordance with the second clock signal CK2.

The pull-up dummy buffer 98 includes either circuit configurations similar to the pull-up output transistor group 60a, or circuit configurations in which transistor sizes are obtained by multiplying the respective transistor sizes in the pull-down output transistor group 60b by a constant. Specifically, the p-MOS transistors P100 to P105 have channel widths equal to $2^0$, $2^1$, $2^2$, $2^3$, $2^4$ and $2^5$ times a unit channel width, respectively. The pull-up counter 94 operates in accordance with the second clock signal CK2.

Figures 18, 19, 20:
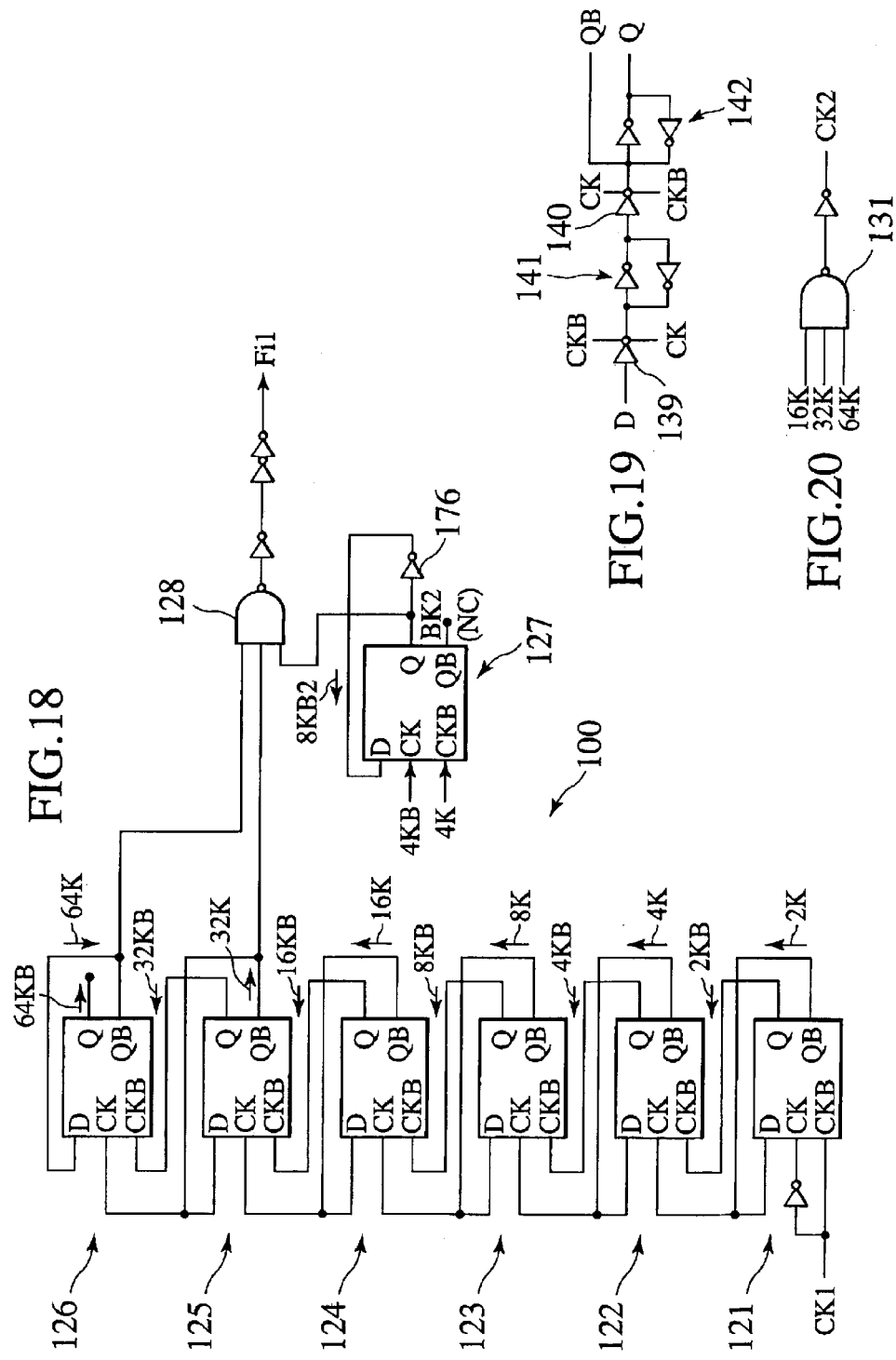
FIG. 18 is a detailed circuit diagram showing a filter signal unit illustrated in FIG. 13.
FIG. 19 is a circuit diagram showing first to seventh frequency divider registers illustrated in FIG. 18.
FIG. 20 is a circuit diagram for explaining a method of generating a second clock signal by use of part of the filter signal unit illustrated in FIG. 18.

As shown in FIG. 18, the filter signal unit 100 includes first to seventh frequency divider registers 121 to 127 being connected to one another, and a second NAND circuit 128 being connected to the fifth, sixth and seventh frequency divider registers 125 to 127. Each of the first to seventh frequency divider registers 121 to 127 includes an input terminal D, a clock terminal CK, an inverted clock terminal CKB, an output terminal Q, and an inverting output terminal QB.

An inverted clock signal CK' is supplied to the clock terminal CK of the first frequency divider register 121. The first clock signal CK1 is supplied to the inverted clock terminal CKB of the first frequency divider register 121. The output terminal Q of the first frequency divider register 121 is connected to the inverted clock terminal CKB of the second frequency register 122. The inverting output terminal QB of the first frequency divider register 121 is connected to the input terminal D of the first frequency divider register 121 and to the clock terminal CK of the second frequency divider register 122.

The output terminal Q of the second frequency divider register 122 is connected to the inverted clock terminal CKB of the third frequency divider register 123. The inverting output terminal QB of the second frequency divider register 122 is connected to the input terminal D of the second frequency divider register 122 and to the clock terminal CK of the third frequency divider register 123. Likewise, the third to sixth frequency divider registers 123 to 126 are connected in series.

The output terminal Q of the second frequency divider register 122 is connected to the clock terminal CK of the seventh frequency divider register 127. The inverting output terminal QB of the second frequency divider register 122 is connected to the inverted clock terminal CKB of the seventh frequency divider register 127. The output terminal Q of the seventh frequency divider register 127 is connected to the input terminal D of the seventh frequency divider register 127 via an inverter circuit 176. An input terminal of the second NAND circuit 128 is connected to the inverting output terminals QB of the fifth and sixth frequency divider registers 125 and 126 and to the output terminal Q of the seventh frequency divider register 127.

The first frequency divider register 121 bisects the first clock signal CK1. The second frequency divider register 122 further bisects the halved first clock signal CK1. Accordingly, the second frequency divider register 122 divides the first clock signal CK1 by four. Likewise, the third to the sixth frequency divider registers 123 to 126 divide the first clock signal CK1 by 8, 16, 32, and 64, respectively. The seventh frequency divider register 127 exports a signal 8K2 to be obtained by shifting the phase of a signal, which is equivalent to one eighth of the first clock signal CK1, by a half cycle. A signal 32K obtained by dividing the first clock signal CK1 by 32, a signal 64K obtained by dividing the first clock signal CK1 by 64, and the signal 8K2 to be supplied from the output terminal Q of the seventh frequency divider register 127 are transferred to the input terminal of the second NAND circuit 128. The second NAND circuit 128 supplies the first filter signal Fil via several inverter circuits.

As shown in FIG. 19, each of the first to seventh frequency divider registers 121 to 127 includes two transfer gates 139 and 140 which open and close in response to signal revels at the clock terminal CK and at the inverted clock terminal CKB, and two latch circuits 141 and 142. The two transfer gates 139 and 140 are disposed alternately with the two latch circuits 141 and 142 connected in series. Each of the first to seventh frequency divider registers 121 to 127 supplies the signal, which is transferred from the input terminal D, from of the output terminal Q synchronously with the clock terminal CK.

As shown in FIG. 20, a signal 16K, the signal 32K and the signal 64K to be supplied respectively from the inverting output terminals QB of the fourth to sixth frequency divider registers 124 to 126 in FIG. 18, are transferred to an input terminal of a third NAND circuit 131. The third NAND circuit 131 supplies the second clock signal CK2, which is obtained by dividing the first clock signal CK1 by 64. The buffer size decision circuit 75 can generate the buffer size signals Pz (Pi) and Pz (Ni) in accordance with the second clock signal CK2, which is transferred from the third NAND circuit 131.

Next, description will be made regarding an operation of the memory chip 11 according to the second embodiment of the present invention with reference to FIG. 12 to FIG. 21.

As shown in FIG. 12, first, the address signal, which is transmitted via data bus 13 from MPU 14 of FIG. 10, is firstly transferred from the address terminal 36 and is supplied to the row selector 32 and to the column selector 33 via the address buffer 37. Based on this address signal, a desired cell in the memory array 31 is selected. In the event of data writing, input data supplied from the I/O terminal 12 are transferred to the write buffer 35 via the input buffer unit 39 and written in the desired memory cell in the memory array 31. On the contrary, in the event of data reading, the first output data signal DA1 read out of a selected memory cell is transferred to the output buffer unit 40 via the sense amplifier 34 and outputted from the output buffer unit 40 to the outside of the memory chip 11 via the I/O terminal 12. Meanwhile, the timing control signal is supplied from the timing control circuit 41 to the row selector 32, the column selector 33, the sense amplifier 34 and the write buffer 35 via the timing buffer 42, and the operation timing upon writing or reading is thereby controlled.

As shown in FIG. 13, the first output data signal DA1, which is read out of the desired memory cell in the memory array 31 in FIG. 12, is imported to the output register 53 synchronously with the inverted clock signal CK' of the first clock signal CK1. Then, the second output data signal DA2 is transferred from the output register 53 to the PI buffer 52 and to the impedance adjustment circuit 54 synchronously with the first clock signal CK1. The buffer size signals Pz (Pi) and Pz (Ni) are supplied from the buffer size signal unit 90 synchronously with the second clock signal CK2. Then, the buffer size signals Pz (Pi) and Pz (Ni) are amplified by the intermediate buffer 71 and supplied to the second register 74. The first filter signal Fil is supplied from the filter signal unit 100 synchronously with the first clock signal CK1. Then, the first filter signal Fil is amplified by the intermediate buffer 72, supplied to the first register 73, and then converted into the second filter signal Fck synchronously with the first clock signal CK1 by use of the first register 73. The second register 74 registers the buffer size signals Pz (Pi) and Pz (Ni) when the second filter signal Fck is at a high level. Thereafter, the impedance adjustment circuit 54 adjusts the buffer size of the PI buffer 52 based on the buffer size signals Pz (Pi) and Pz (Ni) being registered in the second register 74, as well as on the second output data signal DA2. The second output data signal DA2 is supplied from the PI buffer 52 to the outside of the memory chip 11 via the I/O terminal 12.

As shown in FIG. 15, the first filter signal Fil being imported to the transfer gate 145 passes through the transfer gate 145 when the first clock signal CK1 is at a high level. The first filter signal Fil does not pass through the transfer gate 145 when the first clock signal CK1 is at a low level. The first filter signal Fil which passed through the transfer gate 145 is then held by the latch circuit 147, and is supplied to the transfer gate 146 simultaneously. The first filter. signal Fil supplied to the transfer gate 146 passes through the transfer gate 146 when the first clock signal CK1 is at a low level, but does not pass through the transfer gate 146 when the first clock signal CK1 is at a high level. The first filter signal Fil which passed through the transfer gate 146 is then held by the latch circuit 148, and is transferred as the second filter signal Fck simultaneously. The first filter signal Fil is inverted each time the first filter signal Fil passes through the two transfer gates 145 and 146 as well as the two latch circuits 147 and 148. In this way, the first register 73 can convert the first filter signal Fil into the second filter signal Fck, which is synchronized with the first clock signal CK1.

As shown in FIG. 17, the reference voltage (VDDQ/2) is outputted from a connection point of the resistor Ra and the resistor Rb to the comparator 96, by controlling a gate voltage of the n-MOS transistor N113.

In FIG. 17, the operational amplifier OP1 controls the gate voltages of the p-MOS transistors P111 to P113, so that the voltage VZQ at the external terminal 16 is set to the reference voltage (VDDQ/2). Accordingly, the voltage at the node REFIU connected to the drain electrode of the p-MOS transistor P112, and the voltage at the node A1 connected to the drain electrode of the p-MOS transistor P113 are also set to the reference voltage (VDDQ/2). Moreover, the operational amplifier OP4 controls gate voltages of the n-MOS transistors N111 and N112, so that the voltage at the node A1 is set to the reference voltage (VDDQ/2). Accordingly, the voltage at the node REFID connected to the drain electrode of the n-MOS transistor N112 is also set to the reference voltage (VDDQ/2).

The pull-down counter 93 selectively controls the turning on and off of the n-MOS transistors N100 to N105 based on output signals D0 to D5, so that the voltage at the node REFIU coincides with the voltage VZQ at the external terminal 16. Then, the pull-down counter 93 supplies the buffer size signal Pz (Ni) based on the output signals D0 to D5.

The pull-up counter 94 selectively controls the turning on and off of the p-MOS transistors P100 to P105 based on output signals U0 to U5, so that the voltage at the node REFID coincides with the voltage at the node A1. Then, the pull-up counter 94 supplies the buffer size signal Pz (Pi) based on the output signals U0 to U5.

As has been described above, the buffer size signal unit 90 determines the buffer size signals Pz (Pi) and Pz (Ni) on the basis of the external resistor RQ, and adjusts the buffer size signals Pz (Pi) and Pz (Ni) based on the second clock signal CK2. By connecting the external resistor RQ to the external terminal 16 so as to effectuate designation of the impedance to be matched, the buffer size signal unit 90 can seek the buffer size signals Pz (Pi) and Pz (Ni) automatically, so that the buffer size of the PI buffer 52 is made equal to the value of the external resistor RQ or equivalent to the value of the external resistor RQ multiplied by a fixed value.

As shown in FIG. 18, the first frequency divider register 121 imports a signal 2K, which is obtained by dividing the first clock signal CK1 by 2, from the input terminal D synchronously with a high level of the inverted clock signal CK'. Then, the first frequency divider register 121 supplies a signal 2KB, which is obtained by dividing the signal 2K by 2 synchronously with a high level of the first clock signal CK1, from the output terminal Q thereof. Here, the signal 2K and the signal 2KB are complementary signals.

The second frequency divider register 122 imports a signal 4K, which is transferred from the inverting output terminal QB, from the input terminal D synchronously with a high level of the signal 2KB. Then, the second frequency divider register 122 provides a signal 4KB, which is obtained by dividing the signal 2K by 2 synchronously with a high level of the signal 2K, from the output terminal Q thereof. Here, the signal 4K and the signal 4KB are complementary signals. The signal 4K is the signal having a quarter of the frequency of the first clock signal CK1.

Likewise, the third frequency divider register 123 generates a signal 8K, which has one eighth of the frequency of the first clock signal CK1. The fourth frequency divider register 124 generates the signal 16K, which has one sixteenth of the frequency of the first clock signal CK1. The fifth frequency divider register 125 generates the signal 32K, which has one thirty-second of the frequency of the first clock signal CK1. The sixth frequency divider register 126 generates the signal 64K, which has one sixty-fourth of the frequency of the first clock signal CK1. Meanwhile, the seventh frequency divider 127 provides the signal 8K2, which is a signal having a phase shifted by a half cycle of the signal 8K.

The signal 8K2, the signal 32K, and the signal 64K are provided to the second NAND circuit 128. The signal 8K2 is the signal having one eighth of the frequency of the first clock signal CK1 and having a phase shifted by a half cycle therefrom. Accordingly, the second NAND circuit 128 generates a low level for the period equivalent to four clock cycles before and after the sixty-fourth cycle of the first clock signal CK1. That is, the NAND circuit 128 provides the first filter signal Fil. In this way, the filter signal unit 100 can generate the first filter signal Fil including a low level just for the total four clock cycles when the buffer size signals Pz (Pi) and Pz (Ni) change.

Next, description will be made regarding operations of the PI buffer 52, the impedance adjustment circuit 54, and the second register 74 which are shown in FIG. 16. First, description will be made regarding control of the impedance of the pull-up output transistor group 60a.

The buffer size signal Pz (Pi) is imported to the third latch circuit 85 when the second filter signal Fck is at a low level. When the second filter signal Fck is at a high level, import to the third latch circuit 85 is prohibited.

When the second output data signal DA2 is at a low level, the NAND circuit 67 provides a high level irrelevant to the level of the buffer size signal Pz (Pi) held by the first latch circuit 63. Accordingly, the p-channel MOS transistor Pi connected to the NAND circuit 67 is set to an off state.

When the second output data signal DA2 is at a high level, the NAND circuit 67 provides a low level if the buffer size signal Pz (Pi) held by the first latch circuit 63 is at a high level. Accordingly, the p-channel MOS transistor Pi connected to the NAND circuit 67 is in an on state. On the contrary, the NAND circuit 67 provides a high level if the buffer size signal Pz (Pi) held by the first latch circuit 63 is at a low level. Accordingly, the p-channel MOS transistor Pi connected to the NAND circuit 67 is set to the off state.

In this way, the first switch 65 is closed when the second output data signal DA2 is at a high level so as to avoid change of the buffer size signal Pz (Pi) which is held by the first latch circuit 63. Because, the output of the NAND circuit 67 may vary in accordance with the level of the buffer size signal Pz (Pi) held by the third latch circuit 85 if the first switch 65 is open, whereby a noise may be included in the output of the PI buffer 52.

On the contrary, the first switch 65 is made open when the second output data signal DA2 is at a low level so as to effectuate updating of the buffer size signal Pz (Pi) which is held by the first latch circuit 63. Because, the NAND circuit 67 can constantly provide a high level without fluctuation if the second output data signal DA2 is at a low level. Here, it is important that the buffer size of the pull-up output transistor group 60a is to be adjusted before the second output data signal DA2 changes from a low level to a high level.

Next, description will be made regarding control of the impedance of the pull-down output transistor group 60b.

The buffer size signal Pz (Ni) is imported to the fourth latch circuit 86 when the second filter signal Fck is at a low level. When the second filter signal Fck is at a high level, import to the fourth latch circuit 86 is prohibited.

When the second output data signal DA2 is at a high level, the NOR circuit 68 provides a low level without reference to the level of the buffer size signal Pz (Ni) held by the second latch circuit 64. Accordingly, the n-channel MOS transistor Ni connected to the NOR circuit 68 is set to an off state.

When the second output data signal DA2 is at a low level, the NOR circuit 68 provides a high level if the buffer size signal Pz (Ni) held by the second latch circuit 64 is at a low level. Accordingly, the n-channel MOS transistor Ni connected to the NOR circuit 68 is set to an on state. On the contrary, the NOR circuit 68 provides a low level if the buffer size signal Pz (Ni) held by the second latch circuit 64 at a high level. Accordingly, the n-channel MOS transistor Ni connected to the NOR circuit 68 is set to the off state.

In this way, the second switch 66 is closed when the second output data signal DA2 is at a low level so as to avoid change of the buffer size signal Pz (Ni) which is held by the second latch circuit 64. Because, the output of the NOR circuit 68 may vary in accordance with the level of the buffer size signal Pz (Ni) held by the fourth latch circuit 86 if the second switch 66 is open, whereby noise may sometimes included in the output of the PI buffer 52.

On the contrary, the second switch 66 is made opened when the second output data signal DA2 is at a high level so as to effectuate updating of the buffer size signal Pz (Ni) which is held by the second latch circuit 64. Because, the NOR circuit 68 can constantly provide a low level without fluctuation if the second output data signal DA2 is at a high level. Here, it is important that the buffer size of the pull-down output transistor group 60b is adjusted before the second output data signal DA2 changes from a high level to a low level.

As described above, the buffer size signals Pz (Pi) and Pz (Ni), which are held respectively by the third and fourth latch circuits 85 and 86, are changed in response to the level of the second filter signal Fck. The buffer size signals Pz (Pi) and Pz (Ni), which are held respectively by the first and second latch circuits 63 and 64, are changed in response to the level of the second output data signal DA2. Part of the p-channel MOS transistors P0 to P5 and the n-channel MOS transistors N0 to N5 remain closed in accordance with the buffer size signals Pz (Pi) and Pz (Ni), which are held respectively by the first and second latch circuits 63 and 64. Therefore, the impedance adjustment circuit 54 can adjust the buffer size of the PI buffer 52 based on the buffer size signals Pz (Pi) and Pz (Ni), in response to the level of the second output data signal DA2 registered in the second register 74.

Figure 21:
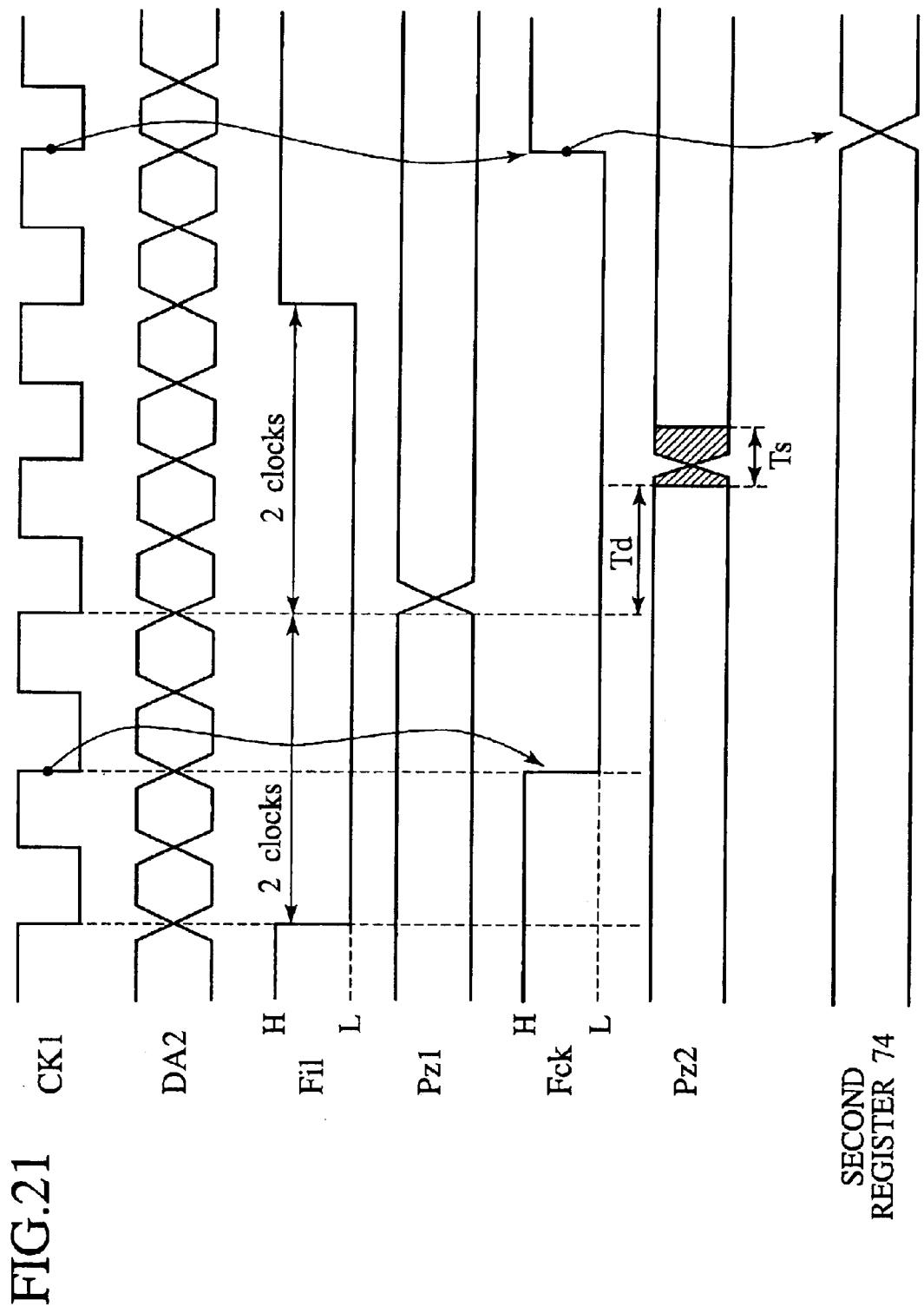
FIG. 21 is a timing chart showing an operation of the memory chip according to the second embodiment of the present invention.

As shown in FIG. 21, the second output data signal DA2 changes synchronously with the first clock signal CK1. The buffer size signals Pz (Pi) and Pz (Ni) change synchronously with the second clock signal CK2. Since the second clock signal CK2 is synchronized with the first clock signal CK1, the buffer size signals Pz (Pi) and Pz (Ni) change synchronously with the first clock signal CK1 as well. In FIG. 21, reference code Pz1 denotes the buffer size signals Pz (Pi) and Pz (Ni) at the time of being provided from the buffer size signal unit 90. The first filter signal Fil is at a low level L just for two clock periods before and after the changing of the buffer size signal Pz1, and the first filter signal Fil is set to a high level at other times. The first wiring 143 and the second wiring 144 shown in FIG. 13 have almost the same wiring delay amounts. Accordingly, both of the first filter signal Fil and the buffer size signal Pz1 are provided to output buffer unit 40 after passage of a certain delay period Td, whereby a timing relation between the first filter signal Fil and the buffer size signal Pz1 is preserved. The first filter signal Fil is converted into the second filter signal Fck synchronously with the first clock signal CK1 by use of the first register 73. In FIG. 21, reference code Pz2 denotes the buffer size signals Pz (Pi) and Pz (Ni) at the time of being provided to the second register 74. The buffer size signal Pz2 changes later than the buffer size signal Pz1 by the delay period Td. However, the second register 74 cannot import the buffer size signal Pz2 because the second filter signal Fck is at a low level. To be more precise, the first and second latch circuits 85 and 86 shown in FIG. 16 cannot hold the buffer size signal Pz2 after the changing. After passage for about two clock periods from change of the buffer size signal Pz2, the second filter signal Fck changes from a low level to a high level. The second register 74 can import the buffer size signal Pz2 after the changing, synchronously with change of the second filter signal Fck to a high level. The "Second register 74" indicates the buffer size signals Pz (Pi) and Pz (Ni), which are registered in the second register 74. The impedance adjustment circuit 54 adjusts the buffer size of the PI buffer 52 synchronously with the second filter signal Fck. As described above, the second filter signal Fck is synchronized with the first clock signal CK1. Accordingly, it is possible to prevent the buffer size of the PI buffer 52 from being changed when the second output data signal DA2 is changing. That is, a changing period of the second output data signal DA2 and a skew period Ts of the buffer size never overlap each other.

As it has been described above, according to the second embodiment of the present invention, the buffer size is changed after the second filter signal Fck, which is synchronized with the first clock signal CK1, is set to a high level. Therefore, it is possible to prevent the buffer size from being adjusted in the course of change of the second output data signal DA2, which is provided synchronously with the first clock signal CK1. Hence, it is possible to prevent the buffer size signals Pz (Pi) and Pz (Ni) from being erroneous held by the impedance adjustment circuit 54. According to the second embodiment of the present invention, it is possible to enhance accuracy in impedance matching in the programmable impedance circuit technology.

Note that updating of the buffer size in the second embodiment of the present invention occurs later by two clock cycles of the first clock signal CK1, as compared to the first embodiment. However, an updating cycle of the buffer size corresponds to thirty-six clock periods of the first clock signal CK1, which is considerably larger than the two clock periods of the first clock signal CK1. As a result, the above-mentioned delay in updating the buffer does not constitute a particular problem.

The buffer size decision circuit 75 may generate the buffer size signals Pz (Pi) and Pz (Ni) in accordance with the first clock signal CK1, instead of the second clock signal CK2.

In FIG. 18, if the first filter signal Fil is set to a low level just in the period equivalent to four clock periods before and after the sixty-fourth pulse of the first clock signal CK1, the seventh frequency register 127 may satisfactorily output a signal 16K, which is the signal having the phase shifted relevant to the signal 16K by a half cycle. Moreover, in the case of setting the updating cycle of the buffer size to every 128 clock periods of the first clock signal CK1, then the signal 8K2, the signal 32K, and the signal 64K may be further bisected and provided to the second NAND circuit 128. The design of the filter signal unit 100 may be modified as appropriate in order to change the pulse width of the first filter signal Fil and the updating cycle of the buffer size as described above.

The intermediate buffer 51a and 51b shown in FIG. 4, or the intermediate buffer unit 71a and 71b shown in FIG. 13 may be omitted. In this way, it is possible to reduce the number of the buffers, and to reduce a layout area of the memory chip 11, accordingly.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An output buffer circuit comprising:
   a programmable impedance buffer configured to match a buffer size thereof with an external impedance, to input a data signal read out of an internal circuit, and to output an output data signal;
   a buffer size decision circuit configured to generate, in response to a first clock signal, a plurality of buffer size signals for determining the buffer size of the programmable impedance buffer; and
   an impedance adjustment circuit configured to adjust the buffer size based on the buffer size signals and in response the data signal.

2. The output buffer circuit of claim 1, wherein the programmable impedance buffer comprises a pull-up output transistor group including a plurality of first transistors connected in parallel, and the impedance adjustment circuit comprises a plurality of pull-up gate control circuits connected to control electrodes of the first transistors, respectively.

3. The output buffer circuit of claim 2, wherein each of the pull-up gate control circuits controls selectively a conduction state of the first transistors so as to change an impedance of the pull-up output transistor group.

4. The output buffer circuit of claim 2, wherein each of the pull-up gate control circuits comprises:
   a first switch configured to open and close depending on the output data signal; and
   a first latch circuit configured to hold one of the buffer size signals when the first switch is open.

5. The output buffer circuit of claim 2, wherein the programmable impedance buffer further comprises a pull-down output transistor group including a plurality of second transistors connected in parallel, and the impedance adjustment circuit further comprises a plurality of pull-down gate control circuits connected to control electrodes of the second transistors, respectively.

6. The output buffer circuit of claim 5, wherein each of the pull-down gate control circuits controls selectively a conduction state of the second transistors so as to change an impedance of the pull-down output transistor group.

7. The output buffer circuit of claim 5, wherein each of the pull-down gate control circuits comprises:
   a second switch configured to open and close depending on the output data signal; and
   a second latch circuit configured to hold one of the buffer size signals when the second switch is open.

8. The output buffer circuit of claim 1, wherein the buffer size decision circuit possesses a clock cycle longer than the first clock signal, and the buffer size decision circuit generates the buffer size signals based on a second clock signal synchronized with the first clock signal.

9. An output buffer circuit comprising:
   a programmable impedance buffer configured to match a buffer size thereof with an external impedance;
   a buffer size decision circuit, comprising,
      a buffer size signal unit configured to generate a plurality of buffer size signals for determining the buffer size of the programmable impedance buffer, and
      a filter signal unit configured to generate a first filter signal, the first filter signal being set to a first level for only a certain period before and after changing of the buffer size signals;
   a first register configured to convert the first filter signal into a second filter signal synchronized with the first clock signal;
   a second register configured to register the buffer size signals in a period when the second filter signal is at a second level being opposite to the first level; and
   an impedance adjustment circuit configured to adjust the buffer size based on the buffer size signals registered in the second register and in response to a data signal read out of an internal circuit.

10. The output buffer circuit of claim 9, wherein the certain period before and after changing of the buffer size signals is equivalent to plural cycles of the first clock signal.

11. The output buffer circuit of claim 9, wherein the buffer size signal unit possesses a clock cycle longer than the first clock signal and generates the buffer size signals based on a second clock signal synchronized with the first clock signal.

12. The output buffer circuit of claim 9, wherein a first wiring connecting the buffer size decision circuit to the first register, and a second wiring connecting the buffer size decision circuit to the second register have almost the same wiring delay amounts.

13. The output buffer circuit of claim 9, wherein the buffer size decision circuit determines the buffer size of the programmable impedance buffer so that the programmable impedance buffer possesses the same impedance as that of an external resistor attached to an outside of the output buffer circuit.

14. The output buffer circuit of claim 9, wherein the programmable impedance buffer comprises a pull-up output transistor group including a plurality of first transistors connected in parallel, and the impedance adjustment circuit comprises a plurality of pull-up gate control circuits connected to control electrodes of the first transistors, respectively.

15. The output buffer circuit of claim 14, wherein each of the pull-up gate control circuits controls selectively a conduction state of the first transistors so as to change an impedance of the pull-up output transistor group.

16. The output buffer circuit of claim 14, wherein each of the pull-up gate control circuits comprises:

a first switch configured to open and close depending on the output data signal; and a first latch circuit configured to hold one of the buffer size signals when the first switch is open.

17. The output buffer circuit of claim 14, wherein the programmable impedance buffer further comprises a pull-down output transistor group including a plurality of second transistors connected in parallel, and the impedance adjustment circuit further comprises a plurality of pull-down gate control circuits connected to control electrodes of the second transistors, respectively.

18. The output buffer circuit of claim 17, wherein each of the pull-down gate control circuits controls selectively a conduction state of the second transistors so as to change an impedance of the pull-down output transistor group.

19. The output buffer circuit of claim 17, wherein each of the pull-down gate control circuits comprises:

a second switch configured to open and close depending on the output data signal; and a second latch circuit configured to hold one of the buffer size signals when the second switch is open.

20. A memory chip comprising:

a memory block configured to storage a data;

a data output unit connected to the memory block, comprising, a programmable impedance buffer configured to match a buffer size thereof with an external impedance, to input a data signal read out of an internal circuit, and to output an output data signal, and an impedances adjustment circuit configured to adjust the buffer size of the programmable impedance buffer based on buffer size signal and in response to the data signal; and a buffer size decision circuit configured to generate, in response to a first clock signal a plurality of buffer size signals for determining the buffer size.

21. The memory chip of claim 20, further comprising:

an intermediate buffer configured to amplify the buffer size signals and transfer the amplified buffer size signals to the data output unit.

22. The memory chip of claim 20, wherein the memory block comprises:

a memory array having a plurality of memory cells disposed in the form of a matrix;

row and column selectors connected to the memory array;

a sense amplifier connected to the column selector; and a write buffer connected to the sense amplifier.

23. A semiconductor device comprising:

a printed circuit board;

a micro processing unit mounted on the printed circuit board;

a data bus connected to the micro processing unit; and a memory chip connected to the data bus, comprising, a memory block configured to storage a data, and a data output unit connected to the memory block, comprising, a programmable impedance buffer configured to match a buffer size thereof with an external impedance, to input a data signal read out of an internal circuit, and to output an output data signal, and an impedance adjustment circuit configured to adjust a buffer size of the programmable impedance buffer based on buffer size signals and in response to the data signal; and a buffer size decision circuit configured to generate, in response to a first clock signal, the buffer size signals for determining the buffer size.

24. An output buffer circuit comprising:

a programmable impedance buffer configured to match a buffer size thereof with an external impedance, to input a data signal read out of an internal circuit, and to output an output data signal;

a buffer size decision circuit configured to generate, in response to a first clock signal, a plurality of buffer size signals for determining the buffer size of the programmable impedance buffer; and a means for adjusting the buffer size based on the buffer size signals and in response to the data signal.

25. An output buffer circuit comprising:

a programmable impedance buffer configured to match a buffer size thereof with an external impedance;

a buffer size decision circuit, comprising, a buffer size signal unit configured to generate a plurality of buffer size signals for determining the buffer size of the programmable impedance buffer, and a filter signal unit configured to generate a first filter signal, the first filter signal being set to a first level for only a certain period before and after changing of the buffer size signals;

a first register configured to convert the first filter signal into a second filter signal synchronized with the first clock signal;

a second register configured to register the buffer size signals in a period when the second filter signal is at a second level being opposite to the first level; and a means for adjusting the buffer size based on the buffer size signals registered in the second register and in response to a data signal read out of an internal circuit.

* * * * *